(12) United States Patent
Wakano et al.

(10) Patent No.: US 9,716,122 B2
(45) Date of Patent: *Jul. 25, 2017

(54) SOLID STATE IMAGING DEVICE AND ELECTRONIC APPARATUS

(71) Applicant: Sony Corporation, Tokyo (JP)

(72) Inventors: Toshifumi Wakano, Kanagawa (JP); Fumihiko Koga, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/296,498

(22) Filed: Oct. 18, 2016

(65) Prior Publication Data

US 2017/0040363 A1    Feb. 9, 2017

Related U.S. Application Data

(63) Continuation of application No. 15/079,168, filed on Mar. 24, 2016, which is a continuation of application
(Continued)

(30) Foreign Application Priority Data

Nov. 30, 2009    (JP) ................. 2009-272441

(51) Int. Cl.
*H04N 5/232*    (2006.01)
*H01L 27/146*    (2006.01)
(Continued)

(52) U.S. Cl.
CPC .... *H01L 27/14612* (2013.01); *H01L 27/1464* (2013.01); *H01L 27/14636* (2013.01);
(Continued)

(58) Field of Classification Search
CPC ......... H01L 27/14609; H01L 27/14643; H01L 27/14641; H01L 27/14689;
(Continued)

(56) References Cited

U.S. PATENT DOCUMENTS 6,821,809 B2    11/2004    Abe et al.
6,859,232 B1    2/2005    Tonami et al.
(Continued)

FOREIGN PATENT DOCUMENTS

CN    1304048 A    7/2001
CN    1893541 A    1/2007
(Continued)

*Primary Examiner* — Robert Bachner
(74) *Attorney, Agent, or Firm* — Wolf, Greenfield & Sacks, P.C.

(57) ABSTRACT

Provided is a solid state imaging device including: a pixel portion where pixel sharing units are disposed in an array shape and where another one pixel transistor group excluding transfer transistors is shared by a plurality of photoelectric conversion portions; transfer wiring lines which are connected to the transfer gate electrodes of the transfer transistors of the pixel sharing unit and which are disposed to extend in a horizontal direction and to be in parallel in a vertical direction as seen from the top plane; and parallel wiring lines which are disposed to be adjacent to the necessary transfer wiring lines in the pixel sharing unit and which are disposed to be in parallel to the transfer wiring lines as seen from the top plane, wherein voltages which are used to suppress potential change of the transfer gate electrodes are supplied to the parallel wiring lines.

30 Claims, 12 Drawing Sheets

Related U.S. Application Data

No. 14/934,826, filed on Nov. 6, 2015, now Pat. No. 9,344,662, which is a continuation of application No. 14/689,875, filed on Apr. 17, 2015, now abandoned, which is a continuation of application No. 14/495,450, filed on Sep. 24, 2014, now Pat. No. 9,049,393, which is a continuation of application No. 14/148,372, filed on Jan. 6, 2014, now Pat. No. 8,885,083, which is a continuation of application No. 12/945,242, filed on Nov. 12, 2010, now Pat. No. 8,659,688.

(51) Int. Cl.
*H04N 5/357* (2011.01)
*H04N 5/374* (2011.01)

(52) U.S. Cl.
CPC .. *H01L 27/14641* (2013.01); *H01L 27/14656* (2013.01); *H04N 5/357* (2013.01); *H04N 5/374* (2013.01)

(58) Field of Classification Search
CPC ........... H01L 27/14612; H01L 27/1464; H01L 27/14636; H01L 27/14603; H01L 27/1463; H01L 27/14607; H01L 27/14627; H01L 27/14812; H01L 27/01
See application file for complete search history.

(56) References Cited

U.S. PATENT DOCUMENTS

| | | | |
|---|---|---|---|
| 6,956,605 B1 | 10/2005 | Hashimoto |
| 6,977,684 B1 | 12/2005 | Hashimoto |
| 7,294,873 B2 | 11/2007 | Suzuki et al. |
| 7,701,029 B2 | 4/2010 | Mabuchi |
| 7,714,917 B2 | 5/2010 | McKee |
| 8,659,688 B2 | 2/2014 | Wakano et al. |
| 8,885,083 B2 | 11/2014 | Wakano et al. |
| 9,049,393 B2 | 6/2015 | Wakano et al. |
| 9,094,623 B2 | 7/2015 | Kawaguchi |
| 9,225,917 B2 | 12/2015 | Shioya |
| 9,344,662 B2 | 5/2016 | Wakano et al. |
| 2007/0007559 A1 | 1/2007 | Lee et al. |
| 2008/0198049 A1 | 8/2008 | Maruyama |
| 2011/0128400 A1 | 6/2011 | Wakano et al. |
| 2013/0075588 A1 | 3/2013 | Kawaguchi |
| 2013/0256512 A1 | 10/2013 | Shioya |
| 2014/0118593 A1 | 5/2014 | Wakano et al. |
| 2015/0009384 A1 | 1/2015 | Wakano et al. |
| 2015/0163420 A1 | 6/2015 | Kawaguchi |
| 2015/0326807 A1 | 11/2015 | Wakano et al. |
| 2016/0065875 A1 | 3/2016 | Wakano et al. |
| 2016/0080677 A1 | 3/2016 | Shioya |
| 2016/0204159 A1 | 7/2016 | Wakano et al. |

FOREIGN PATENT DOCUMENTS

| | | |
|---|---|---|
| CN | 101232286 A | 7/2008 |
| JP | 2003-031785 | 1/2003 |
| JP | 2007-115994 | 5/2007 |
| JP | 2008-294218 | 12/2008 |
| JP | 2009-135319 | 6/2009 |

SOLID STATE IMAGING DEVICE AND ELECTRONIC APPARATUS

CROSS REFERENCE TO RELATED APPLICATIONS

The present application is a continuation of U.S. patent application Ser. No. 15/079,168, filed Mar. 24, 2016, which is a continuation of U.S. patent application Ser. No. 14/934,826, filed Nov. 6, 2015, now U.S. Pat. No. 9,344,662, which is a continuation of U.S. patent application Ser. No. 14/689,875, filed Apr. 17, 2015, which is a continuation of U.S. patent application Ser. No. 14/495,450, filed Sep. 24, 2014, now U.S. Pat. No. 9,049,393, which is a continuation of U.S. patent application Ser. No. 14/148,372, filed Jan. 6, 2014, now U.S. Pat. No. 8,885,083, which is a continuation of U.S. patent application Ser. No. 12/945,242, filed Nov. 12, 2010, now U.S. Pat. No. 8,659,688, which claims priority to Japanese Patent Application Serial No. JP 2009-272441, filed in the Japan Patent Office on Nov. 30, 2009, the entire contents of each of which is hereby incorporated by reference.

BACKGROUND OF THE INVENTION

1. Field of the Invention

The invention relates to a solid state imaging device and an electronic apparatus adapted to a camera or the like employing the solid state imaging device.

2. Description of the Related Art

As a solid state imaging device, there is known a CMOS solid state imaging device. Since the CMOS solid state imaging device has a low power source voltage and low power consumption, the CMOS solid state imaging device has been used for a digital still camera, a digital video camera, and various types of mobile terminals such as a mobile phone attached with a camera attached.

The CMOS solid state imaging device includes a pixel portion where a plurality of pixels including photodiodes as photoelectric conversion portions and a plurality of pixel transistors are disposed in a two-dimensional array shape with regularity and a peripheral circuit portion which is disposed in the vicinity of the pixel portion.

In general, in a front illumination type CMOS solid state imaging device in the related art, the interval between the wiring lines is configured to be an interval defined by the minimum design rule so that the wiring lines provided to the pixel portion are not disposed to pass over the photodiodes which are photoelectric conversion portions in the optical point of view.

In the front illumination type CMOS solid state imaging device, generally, in the case where the accumulating time is long or in the case where an amount of incident light is large, the accumulated charges of the photodiode exceeds the capacitance of the photodiode so as to overflow, so that a so-called blooming phenomenon occurs, which causes deterioration of image quality. Therefore, in order to prevent the blooming, a so-called vertical overflow structure of releasing charges to a substrate has been configured. In other words, in the situation where the transfer gate is turned off, the potential is designed to be lowered, so that a decrease in a saturation signal amount Qs is prevented, and almost no influence is designed to be exerted to the potential change of the preceding transfer gate, so that a variation in the saturation signal amount is avoided.

In addition, recently, a back illumination type CMOS solid state imaging device has drawn attention (refer to Japanese Unexamined Patent Application Publication Nos. 2007-115994 and 2003-31785). In the back illumination type CMOS solid state imaging device, light is incident to a rear surface of a substrate at a side opposing the side where wiring lines are disposed, and the wiring lines of a pixel portion may be disposed to pass over photodiodes, so that a degree of freedom in the layout is greatly increased. In involvement with miniaturization of a pixel size, a pixel sharing type CMOS solid state imaging device where one pixel transistor group excluding transfer transistors is shared by a plurality of photodiodes is also disclosed (refer to Japanese Unexamined Patent Application Publication Nos. 2008-294218 and 2009-135319)

Until the pixel size is decreased down to about 1.5 µm, the layout may be implemented by configured the interval between the wiring lines not so as to be narrowed by using the pixel sharing type. In addition, in the back illumination type CMOS solid state imaging device, in general, the lateral overflow is formed as an approach for countering the blooming. In the lateral overflow, charges are allowed to be released through the floating diffusion portion from a portion under the transfer gate. In the back illumination type CMOS solid state imaging device, there is a disadvantage in the potential change of the transfer gate due to the influence of the lateral overflow structure. However, in the case where the pixel size is large, the interval between the transfer wiring lines may be configured to be relatively large, or the pixel sharing type, where the maximum pixel aperture ratio may not be obtained but the interval between the transfer wiring lines may be easily taken, has been employed to obtain relatively small coupling between the transfer wiring lines, so that the aforementioned problem has been avoided. In other words, if the pixel size is large, the interval between the wiring lines may not be narrowed, so that no problem occurs in that signal loss due to the potential change of the transfer gate according to the coupling between the transfer wiring lines. In addition, the pixel sharing type is configured so vertical four pixels are shared without narrowing the interval between the transfer wiring lines, so that no problem is caused by signal loss due to the potential change of the transfer gate.

SUMMARY OF THE INVENTION

For example, if the miniaturization of the pixel size proceeds down to about 1 µm or less, in the back illumination type CMOS solid state imaging device, although a degree of freedom in the layout of the wiring lines in the pixel portion is high, the interval between the adjacent wiring lines relatively reaches the interval defined by the design rule. In addition, in order to maximize the aperture ratio of the photodiode by the miniaturization of the pixel size, if horizontal 2×vertical 2n (n=1, 2, . . . ) pixels are used as a pixel sharing unit, the wiring lines may have to be necessarily concentrated, so that the interval between the adjacent wiring lines is decreased.

In this way, if the interval between the adjacent wiring lines is small, the capacitance coupling between the wiring lines may not be neglected. Particularly, in the transfer wiring line which supplies a pulse voltage to the transfer gate, if the voltage at the time of turning off the transfer gate is changed due to the influence of other wiring lines, the potential in the silicon under the transfer gate is changed. Due to the potential change, the charges accumulated in the photodiodes are leaked into a floating diffusion portion (FD), so that the saturation signal amount (Qs) may be changed, or so that a variation in the saturation signal amount between photodiodes may be increased. Therefore, the saturation signal amount is necessarily set to a low-level specification, so that there is a problem in terms of imaging characteristics.

Particularly, due to the aforementioned problem in terms of structure, the back illumination type CMOS solid state imaging device may have to be configured as a lateral overflow type. In other words, the potential of a portion under the transfer gate is intentionally configured to be relatively high even in the off state of the transfer gate in comparison with the front illumination type CMOS solid state imaging device, where the portion under some transfer gates may be necessarily opened so as to facilitate the overflow. Therefore, due to the change in voltage of the transfer gate, the potential change in the silicon is increased in comparison with the front illumination type CMOS solid state imaging device. As a result, problems occur in that the saturation signal amount is decreased or in that a variation in the saturation signal amount is increased due to the influence of the capacitance coupling.

It is desirable to provide a solid state imaging device capable of suppressing a variation in a saturation signal amount involved with miniaturization of a pixel size.

It is desirable to provide an electronic apparatus such as a camera employing the solid state imaging device.

According to an embodiment of the invention, there is provided a solid state imaging device including a pixel portion where pixel sharing units are aligned in an array shape and where another one pixel transistor group excluding transfer transistors is shared by a plurality of photoelectric conversion portions. The pixel portion is provided with transfer wiring lines which are connected to the transfer gate electrodes of the transfer transistors of the pixel sharing unit and which are disposed to extend in a horizontal direction and to be in parallel in a vertical direction as seen from the top plane. In addition, the pixel portion is provided with parallel wiring lines which are disposed to be adjacent to the necessary transfer wiring lines in the pixel sharing unit and which are disposed to be in parallel to the transfer wiring lines as seen from the top plane. In addition, voltages which are used to suppress potential change of the transfer gate electrodes are supplied to the parallel wiring lines. Preferably, as the voltage, a pulse voltage or a constant voltage is used.

In the solid state imaging device according to the embodiment of the invention, since the parallel wiring lines which supply the voltages for suppressing the potential change of the transfer wiring lines are disposed to be adjacent to the transfer wiring lines, the influence of the capacitance coupling between transfer wiring lines is decreased, so that the potential change of the transfer gate electrode in the pixel driving period is suppressed.

According to another embodiment of the invention, there is provided a solid state imaging device including a pixel portion where unit pixels configured with a photoelectric conversion portion and a pixel transistor are disposed in an array shape. The pixel portion is provided with transfer wiring lines which are connected to the transfer gate electrodes of transfer transistors included in the pixel transistors of unit pixels and which are disposed to extend in a horizontal direction and to be in parallel in a vertical direction as seen from the top plane. In addition, the pixel portion is provided with parallel wiring lines which are disposed to be adjacent to the outermost transfer wiring lines and which are disposed to be in parallel to the transfer wiring lines as seen from the top plane, and a pulse voltage is supplied to at least one of the parallel wiring lines.

In the solid state imaging device according to the embodiment of the invention, the parallel wiring lines are disposed to be adjacent to the outermost transfer wiring lines, and a pulse voltage is supplied to at least one of the parallel wiring lines, so that the coupling capacitances between the transfer wiring lines are equalized. Accordingly, the potential change of the transfer gate electrode in the pixel driving period is suppressed.

According to still another embodiment of the invention, there is provided an electronic apparatus including: a solid state imaging device; an optical system which guides incident light to photodiodes of the solid state imaging device; and a signal processing circuit which processes an output signal of the solid state imaging device. The solid state imaging device is configured as the aforementioned solid state imaging device according to the embodiment of the invention. Accordingly, the potential change of the transfer gate electrode in the pixel driving period is suppressed.

In an electronic apparatus according to the embodiment of the invention, since the aforementioned solid state imaging device according to the embodiment of the invention is included, the potential change of the transfer gate electrode in the pixel driving period is suppressed.

According to a solid state imaging device according to the embodiment of the invention, since the potential change of the transfer gate electrode in the pixel driving period is suppressed, it is possible to suppress the variation of the saturation signal amount involved with the miniaturization of the pixel size.

According to an electronic apparatus according to the embodiment of the invention, since the potential change of the transfer gate electrode in the pixel driving period is suppressed in the solid state imaging device, it is possible to suppress the variation of the saturation signal amount involved with the miniaturization of the pixel size. Therefore, it is possible to provide a high-quality electronic apparatus of which the image quality is improved.

DESCRIPTION OF THE PREFERRED EMBODIMENTS

Hereinafter, embodiments of the inventions (hereinafter, referred to as embodiments) will be described. The description will be made in the following order.

1. Example of Schematic Configuration of CMOS Solid State Imaging device
2. First Embodiment (Example of Configuration of Solid State Imaging device)
3. Second Embodiment (Example of Configuration of Solid State Imaging device)
4. Third Embodiment (Example of Configuration of Solid State Imaging device)
5. Fourth Embodiment (Example of Configuration of Solid State Imaging device)
6. Fifth Embodiment (Example of Configuration of Solid State Imaging device)
7. Sixth Embodiment (Example of Configuration of Solid State Imaging device)
8. Seventh Embodiment (Example of Electronic Apparatus)

1. Example of Schematic Configuration of CMOS Solid State Imaging Device

Figure 8:
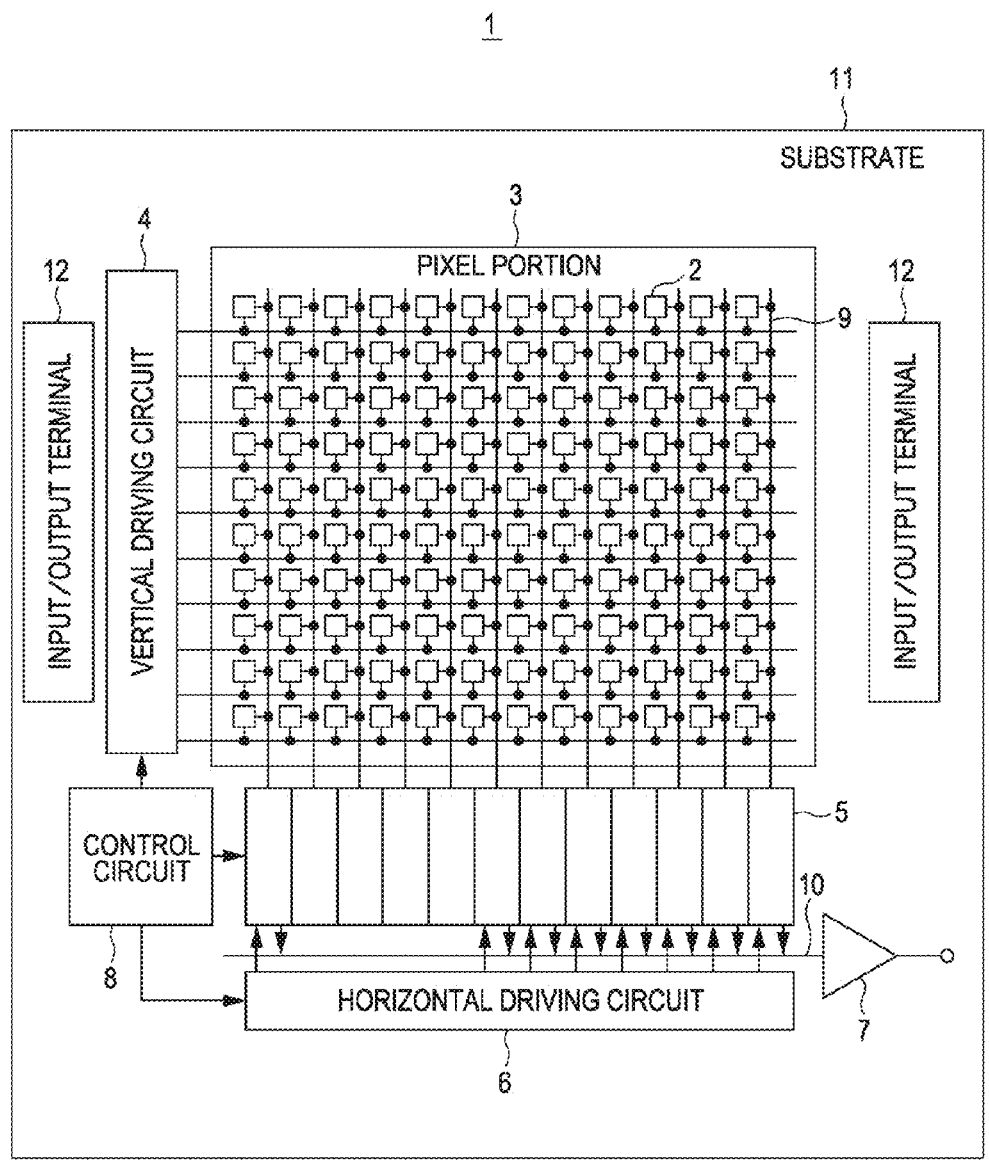
FIG. 8 is a schematic diagram illustrating an example of a CMOS solid state imaging device adapted to a solid state imaging device according to the embodiment of the invention.

FIG. 8 illustrates a schematic configuration of an example of a CMOS solid state imaging device adapted to the embodiments of the invention. In this example, as illustrated in FIG. 8, the solid state imaging device 1 includes a pixel portion 3 (a so-called imaging area), where a plurality of pixels 2 including photoelectric conversion portions are disposed regularly in a two-dimensional array on a semiconductor substrate 11, for example, a silicon substrate, and a peripheral circuit portion. As the pixel 2, a unit pixel constructed with one photoelectric conversion portion and a plurality of pixel transistors may be employed. In addition, as the pixel 2, a so-called pixel sharing structure, where one group of pixel transistors excluding transfer transistors is configured to be shared by a plurality of the photoelectric conversion portions, may be employed. As described later, the plurality of pixel transistors may be constructed with three transistors including a transfer transistor, a reset transistor, and an amplification transistor or four transistors including a selection transistor and the aforementioned three transistors.

The peripheral circuit portion includes a vertical driving circuit 4, column signal processing circuits 5, a horizontal driving circuit 6, an output circuit 7, a control circuit 8, and the like.

The control circuit 8 receives an input clock and data commanding an operation mode or the like and outputs data such as internal information on the solid state imaging device. In other words, the control circuit 8 generates a clock signal or a control signal used as a reference for operations of the vertical driving circuit 4, the column signal processing circuits 5, the horizontal driving circuit 6, and the like according to a vertical synchronization signal, a horizontal synchronization signal, and a master clock. Next, the control circuit 8 inputs these signals to the vertical driving circuit 4, the column signal processing circuits 5, the horizontal driving circuit 6, and the like.

The vertical driving circuit 4 is configured with, for example, shift registers. The vertical driving circuit 4 selects a pixel driving wiring line and supplies a pulse for driving pixels to the selected pixel driving wiring line, so that the pixels are driven in units of a row. In other words, the vertical driving circuit 4 selectively drives the pixels 2 of the pixel portion 3 in units of a row sequentially in the vertical direction. Next, pixel signals corresponding to signal charges generated according to received light amounts in the photoelectric conversion devices, for example, photodiodes of the pixels 2 are supplied through the vertical signal lines 9 to the column signal processing circuits 5.

The column signal processing circuit 5 is disposed corresponding to, for example, each column of the pixels 2 to perform a signal process such as a process of removing noise from a signal output from one row of pixels 2 for each column of the pixels. In other words, the column signal processing circuit 5 performs a signal process such as CDS for removing fixed pattern noise unique to the pixel 2, signal amplification, and AD conversion. Horizontal selection switches (not shown) are provided between the output stages of the column signal processing circuits 5 and a horizontal signal line 10.

The horizontal driving circuit 6 is configured with, for example, shift registers. The horizontal driving circuit 6 sequentially outputs horizontal scan pulses to sequentially select the column signal processing circuits 5, so that the pixel signals are allowed to be output from the column signal processing circuits 5 to the horizontal signal line 10.

The output circuit 7 performs a signal process on the signals, which are sequentially output from the column signal processing circuits 5 through the horizontal signal line 10, and outputs processed signals. For example, in some cases, the output circuit 7 may perform only a buffering process, and in other cases, the output circuit 7 may also perform various digital signal processes such as a black level adjusting process and a column variation correction process. An input/output terminal 12 communicates signals with external portions.

Figure 9:
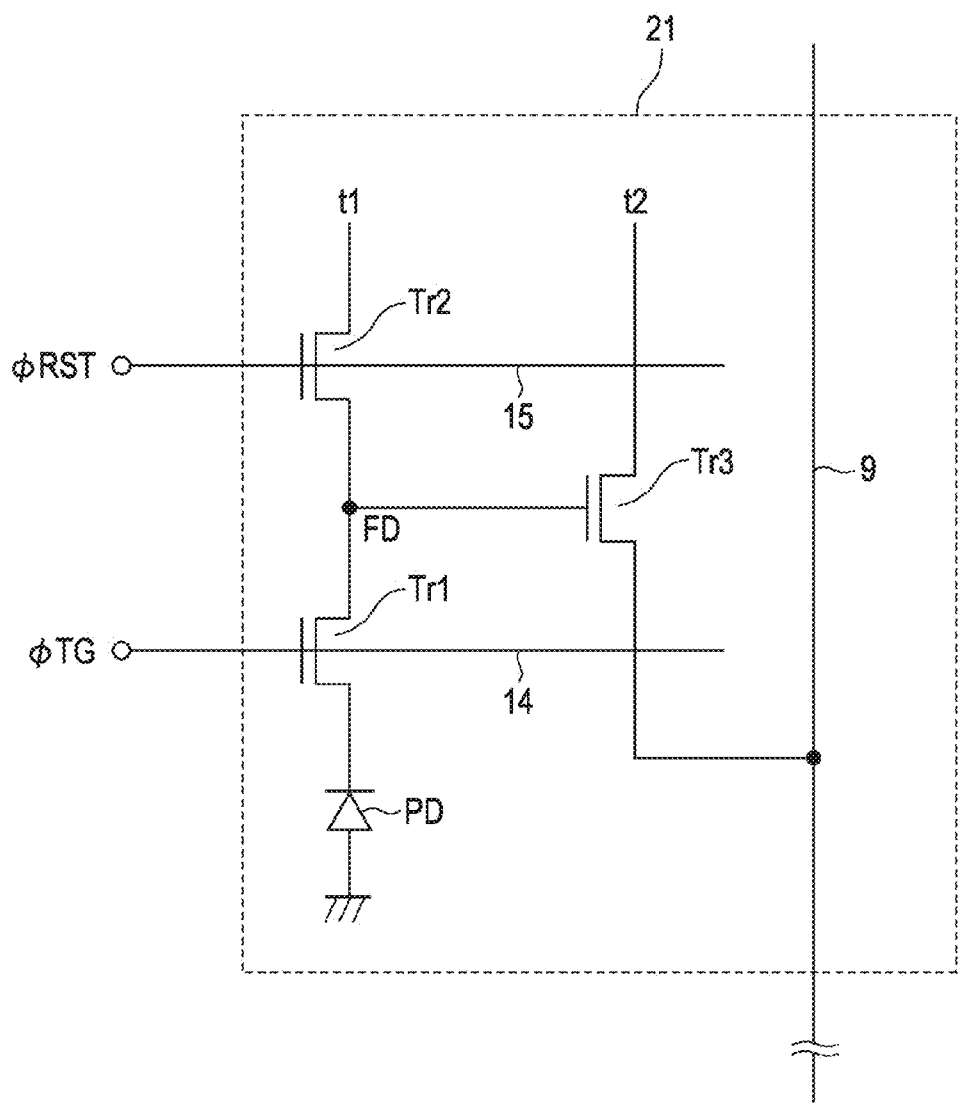
FIG. 9 is an equivalent circuit diagram illustrating an example of a unit pixel.

FIG. 9 illustrates an equivalent circuit of an example of a unit pixel. The unit pixel 21 according to the example, which is surrounded by a dashed line, is configured with a photodiode PD which is a photoelectric conversion portion and three pixel transistors. The three pixel transistors include a transfer transistor Tr1, a reset transistor Tr2, and an amplification transistor Tr3. Herein, as the pixel transistors Tr1 to Tr3, for example, n-channel MOS transistors are used.

The photodiode PD is connected to the transfer transistor Tr1. The transfer transistor Tr1 is connected through a floating diffusion portion FD to the reset transistor Tr2. The signal charges (in this case, electrons), which are photoelectrically converted by the photodiode PD and accumulated therein, are transferred to the floating diffusion portion FD by applying a transfer pulse φTRG to the gate of the transfer transistor Tr1 through the transfer wiring line 14.

The floating diffusion portion PD is connected to the gate of the amplification transistor Tr3. In this case, the source of the reset transistor Tr2 (the drain of the transfer transistor Tr1) is configured as the floating diffusion portion FD. Before transferring the signal charges from the photodiode PD to the floating diffusion portion FD, by applying a reset pulse φRST to the reset gate through the reset wiring line 15, the potential of the floating diffusion portion FD is reset.

The source of the amplification transistor Tr3 is connected to the vertical signal line 9. The selection and non-selection of a pixel is distinguished by using the potential of the floating diffusion portion FD. The amplification transistor Tr3 outputs the potential of the floating diffusion portion FD, after the resetting is performed by the reset transistor Tr2, as the reset level to the vertical signal line 9. In addition, the amplification transistor Tr3 outputs the potential of the floating diffusion portion FD, after the transferring of the signal charges is performed by the transfer transistor Tr1, as the signal level to the vertical signal line 9.

Figure 10:
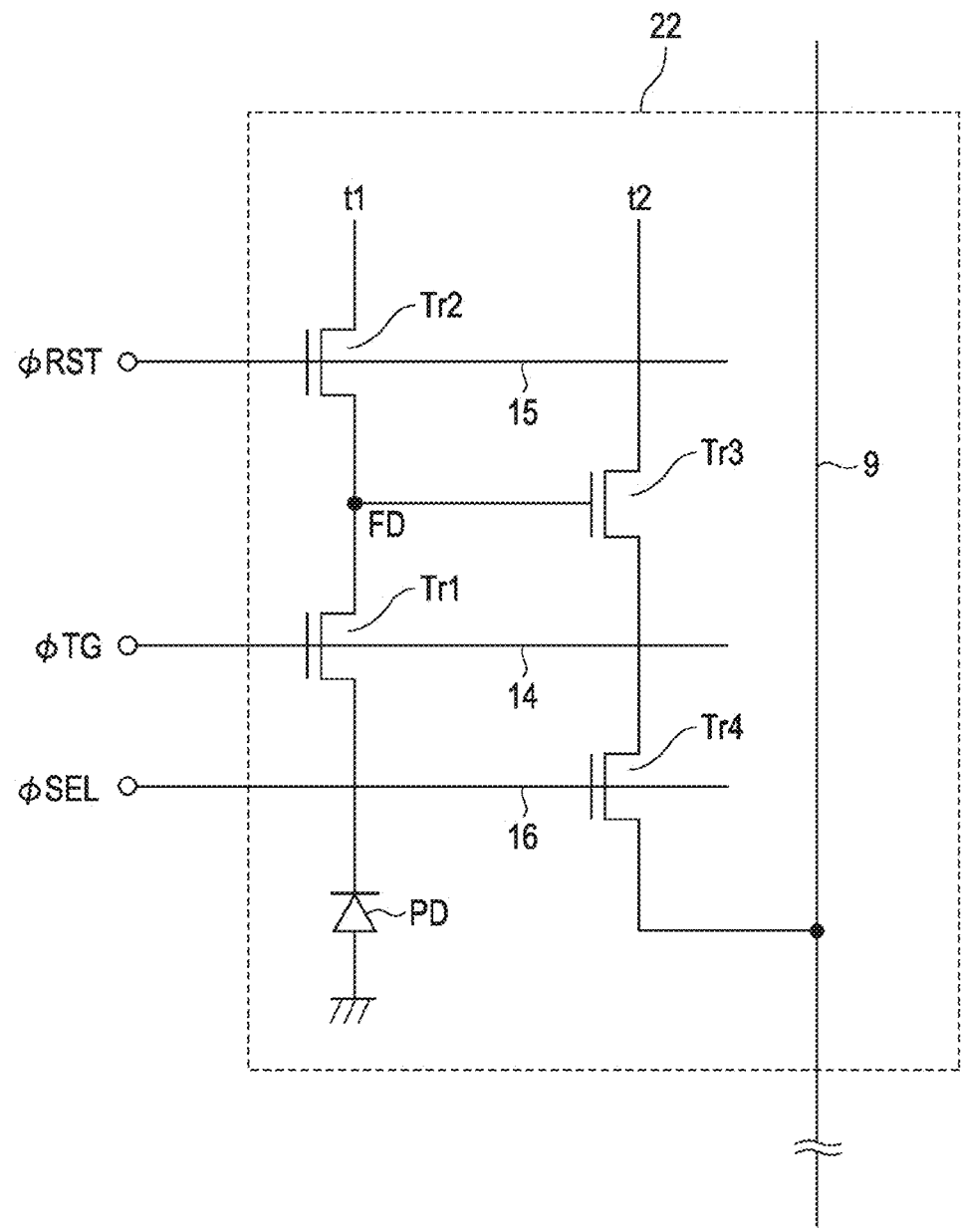
FIG. 10 is an equivalent circuit diagram illustrating another example of a unit pixel.

FIG. 10 illustrates an equivalent circuit of another example of the unit pixel. The unit pixel 22 according to the example is configured with a photodiode PD which becomes a photoelectric conversion portion and four pixel transistors. The four pixel transistors include a transfer transistor Tr1, a reset transistor Tr2, an amplification transistor Tr3, and a selection transistor Tr4. In this example, as these pixel transistors Tr1 to Tr4, for example, n-channel MOS transistors may be used.

The photodiode PD is connected to the transfer transistor Tr1. The transfer transistor Tr1 is connected to through the floating diffusion portion FD to the reset transistor Tr2. The signal charges (in this case, electrons), which are photoelectrically converted by the photodiode PD and accumulated therein, are transferred to the floating diffusion portion FD by applying a transfer pulse φTRG to the gate of the transfer transistor Tr1 through the transfer wiring line 14.

The floating diffusion portion FD is connected to the gate of the amplification transistor Tr3. Before transferring the signal charges from the photodiode PD to the floating diffusion portion FD, by applying a reset pulse φRST to the reset gate through the reset wiring line 15, the potential of the floating diffusion portion FD is reset.

The source of the amplification transistor Tr3 is connected to the drain of the selection transistor Tr4, and the source of the selection transistor is connected to the vertical signal line 9. By applying a selection pulse φSEL to the gate of the selection transistor Tr4 through the selection wiring line 16, the on state is obtained, so that a pixel is selected. The amplification transistor Tr3 outputs the potential of the floating diffusion portion FD, after the resetting is performed by the reset transistor Tr2, as the reset level through the selection transistor Tr4 to the vertical signal line 9. In addition, the amplification transistor Tr3 outputs the potential of the floating diffusion portion FD, after the transferring of the signal charges is performed by the transfer transistor Tr1, as the signal level through the selection transistor Tr4 to the vertical signal line 9. In addition, a configuration where the selection transistor 115 is connected to the drain of the amplification transistor Tr3 may be employed. In this case, the source of the amplification transistor Tr3 is connected to the vertical signal line 9.

Figure 11:
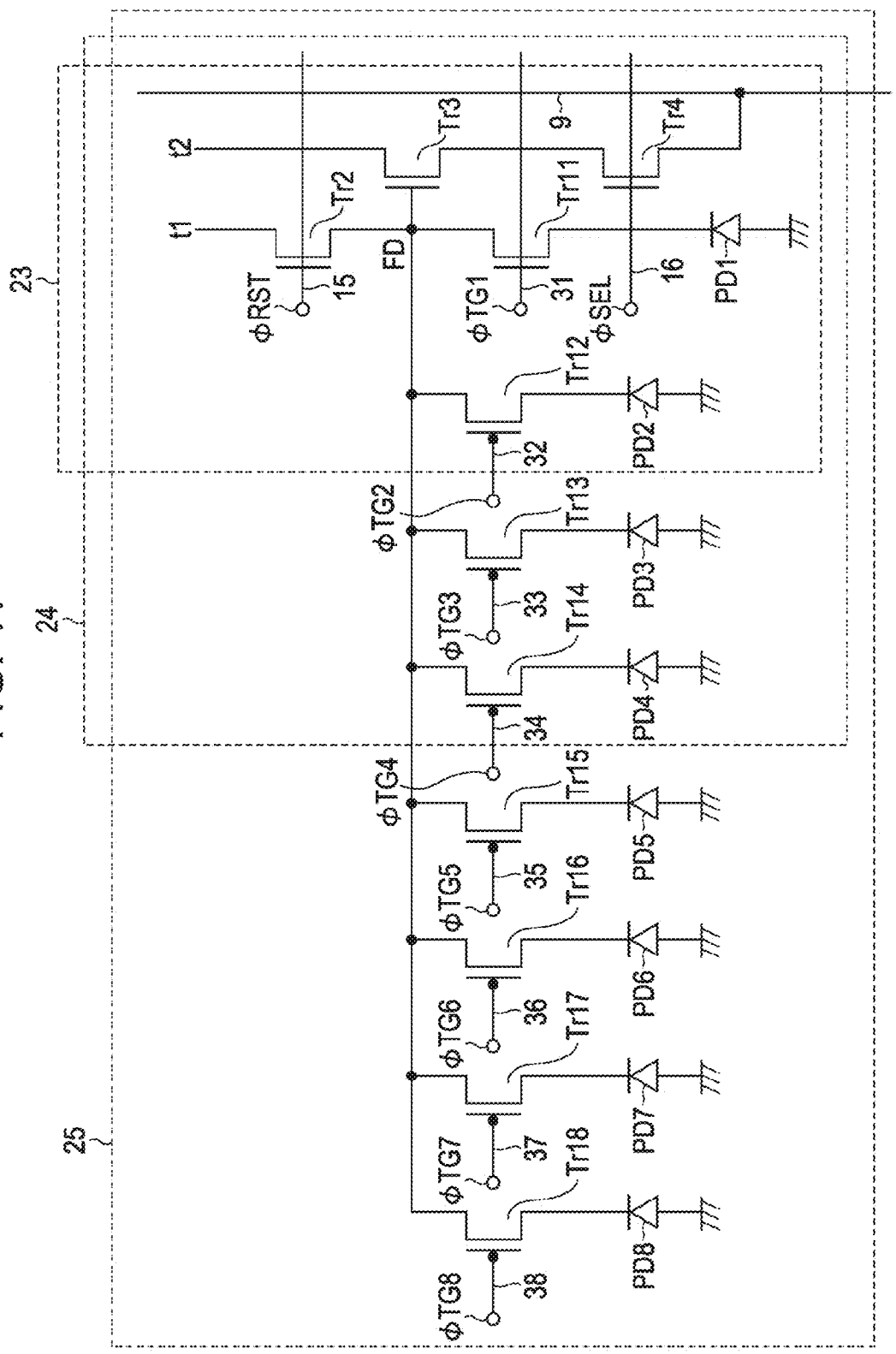
FIG. 11 is an equivalent circuit diagram illustrating an example of a pixel sharing unit.

FIG. 11 illustrates an equivalent circuit of a multi-pixel sharing structure. In FIG. 11, a 2-pixel sharing unit 23, a 4-pixel sharing unit 24, and an 8-pixel sharing unit 25 are illustrated. For example, the 2-pixel sharing unit 23 is configured by allowing two photodiodes PD1 and PD2, which become photoelectric conversion portions, to share another one pixel transistor group excluding the transfer transistors Tr11 and Tr12. In other words, the 2-pixel sharing unit 23 is configured with two photodiodes PD, two transfer transistors Tr11 and Tr12, a floating diffusion portion FD, a reset transistor Tr2, an amplification transistor Tr3, and a selection transistor Tr4. In addition, a configuration where the selection transistor is omitted may be employed. The photodiodes PD1 and PD2 are connected to the corresponding transfer transistors Tr11 and Tr12. The transfer transistors Tr11 and Tr12 are connected through the shared floating diffusion portion FD to the reset transistor Tr2, and the floating diffusion portion PD is connected to the gate of the amplification transistor Tr3. The source of the amplification transistor Tr3 is connected to the drain of the selection transistor Tr4. The source of the selection transistor Tr4 is connected to the vertical signal line 9. The transfer pulses φTG1 and φTG2 are applied to the gates of the transfer transistors Tr11 and Tr12 through the transfer wiring lines 31 and 32. The reset pulse φRST is applied to the gate of the reset transistor Tr2 through the reset wiring line 15. The selection pulse φSEL is applied to the gate of the selection transistor Tr4 through the selection wiring line 16.

The 4-pixel sharing unit 24 is configured by adding two photodiodes PD3 and PD4 and two transfer transistors Tr13 and Tr14 to the circuit configuration of the 2-pixel sharing unit 23. In other words, the corresponding four transfer transistors Tr11 to Tr14 are connected to a total of four photodiodes PD [PD1 to PD4], and the sources of the transfer transistors Tr11 to Tr14 are commonly connected to the floating diffusion portion FD.

The 8-pixel sharing unit 25 is configured by adding four photodiodes PD5 to PD8 and four transfer transistors Tr15 to Tr18 to the circuit configuration of the 4-pixel sharing unit 24. In other words, the corresponding eight transfer transistors Tr11 to Tr18 are connected to a total of eight photodiodes PD [PD1 to PD8], and the sources of the transfer transistors Tr11 to Tr18 are commonly connected to the floating diffusion portion FD.

In any one of the cases of FIGS. 9, 10, and 11, although voltages are supplied to the drain terminals t1 and t2 of the reset transistor and the amplification transistor, any voltage supply method such as a common/non-common voltage supply, constant (fixed) voltage supply, voltage supply using pulse driving, or the like may be employed. In general, the power source VDD is supplied to the drain terminals t1 and t2. A two-series power source may be used. In other words, the drain terminals of the reset transistor and the amplification transistor may be commonly connected or may be non-commonly (independently) configured. In the case where the drain terminals are independently configured, different power source voltages may be set thereto. In addition, since all the aforementioned drain terminals are assumed to be supplied with the power source voltage, the constant (fixed) voltage is generally employed. However, pulse driving, that is, supplying a high voltage at only the driving period may be employed without causing a problem.

Now, a basic concept of the invention is described. In a CMOS solid state imaging device, although the suppression of the potential change in the silicon caused by the potential change of the transfer gate is considered in order to avoid a decrease in the saturation signal amount, it is very difficult to implement the suppression. In other words, since large capacitance couplings between the wiring lines actually exist, it is difficult to suppress the potential change. In addition, in the back illumination type CMOS solid state imaging device, lateral overflow is necessarily formed to overcome the deterioration in the image quality, and it is actually difficult to sustain a relatively low potential at the off time of the transfer gate in comparison with a front illumination type CMOS solid state imaging device.

If the potential change of the transfer gate is equalized in order to suppress the variation in the saturation signal amount, the potential change in the silicon under the transfer gate is also equalized, so that the variation in the saturation signal amount is removed. In order to equalize the potential changes of the transfer gates, reformation of the layout of the wiring lines in the pixel portion may have to be performed.

Therefore, if the coupling capacitance between the transfer wiring line and the other transfer wiring line is uniformed by designing the layout of the wiring lines in the pixel portion, the potential changes of the transfer wiring lines are equalized among the transfer gates, the variation in the saturation signal amount may be suppressed. The invention is to provide a CMOS solid state imaging device capable of suppressing the variation in the saturation signal amount based on this concept.

The invention may be adapted to all the solid state imaging device where the pixels having the aforementioned configuration are disposed in a two-dimensional array shape. Particularly, the embodiment may be very appropriately adapted to a pixel sharing CMOS solid state imaging device. In addition, the embodiment may be very appropriately adapted to a back illumination type CMOS solid state imaging device.

2. First Embodiment

Example of Configuration of Solid State Imaging Device

Figure 1:
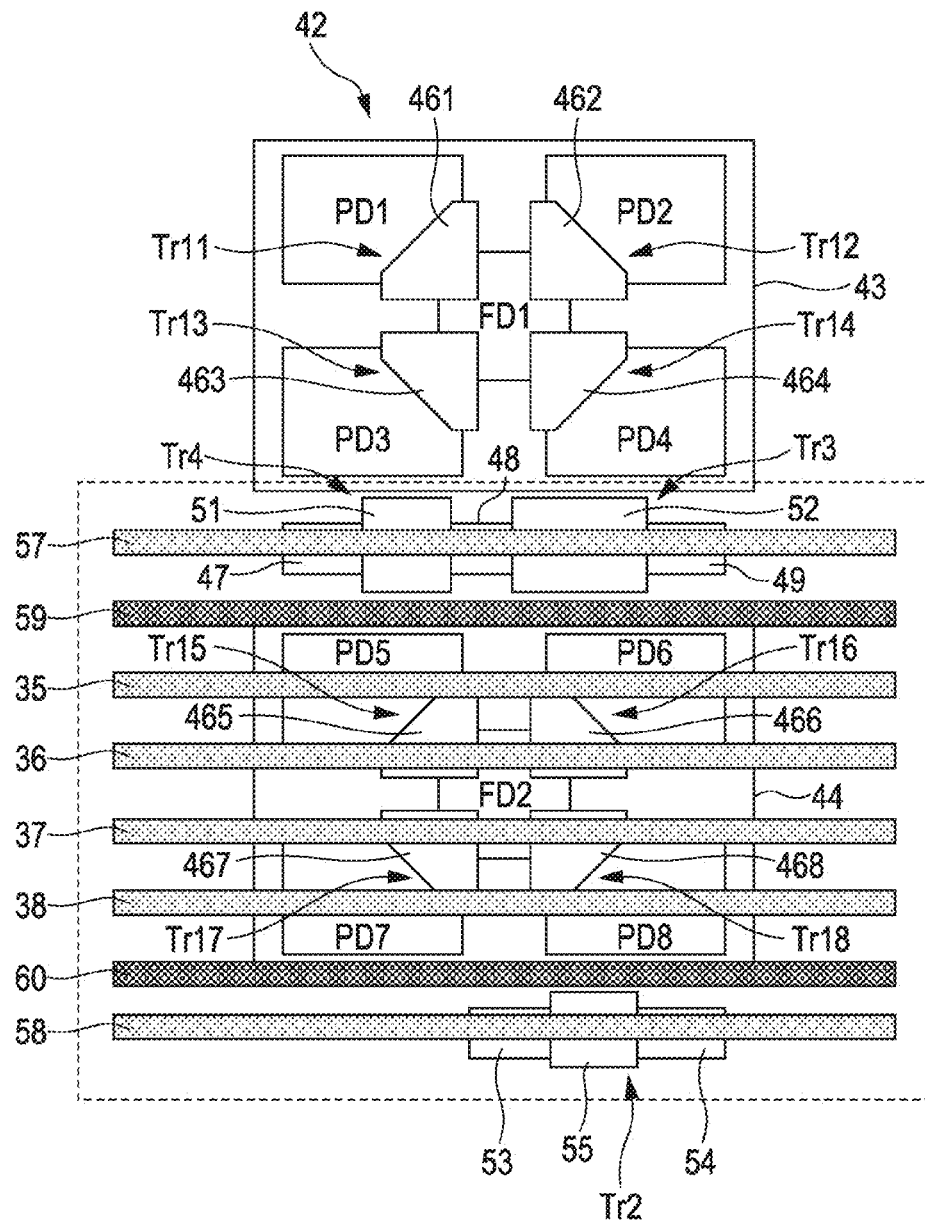
FIG. 1 is a schematic diagram illustrating a configuration of main components of a solid state imaging device according to a first embodiment of the invention.

FIG. 1 illustrates a solid state imaging device according to a first embodiment of the invention. The embodiment may be adapted to a back illumination type CMOS solid state imaging device, where pixel sharing units of four pixels, eight pixels, or horizontal 2×vertical 2n (n is a positive integer, that is, n=1, 2, 3, . . . ) pixels are aligned in a two-dimensional array shape. As the pixel sharing unit, horizontal 2×vertical 2 (total four) pixels constitute one unit irrespective of the number of shared pixels. Therefore, in FIG. 1, the embodiment is described by using one unit of the horizontal 2×vertical 2 (total four) pixels.

As the solid state imaging device according to the first embodiment, a back illumination type CMOS solid state imaging device where 8-pixel sharing units are disposed in a two-dimensional array shape is adapted. In the solid state imaging device 41 according to the first embodiment, as illustrated in FIG. 1, a pixel portion is configured by disposing 8-pixel sharing units 42, where photodiodes PD [PD1 to PD8] of eight pixels are disposed, in a two-dimensional array shape. Similarly to a general case, in the back illumination type CMOS solid state imaging device 41, pixel transistors are formed on the front surface of a semiconductor substrate, and a wiring line layer where a plurality of layers of wiring lines constructed with metal layers are disposed is formed over the pixel transistors with an interlayer insulating layer interposed therebetween. A color filter layer and on-chip lenses are formed on the rear surface of the semiconductor substrate, and light is incident from the rear surface side of the substrate. In other words, the back illumination type has a configuration where the wiring line layer is formed on the side opposite to the light incident plane.

In the 8-pixel sharing unit 42, two sets of configurations where one floating diffusion portion FD is shared by horizontal 2×vertical 2 (total four) photodiodes PD are disposed vertically. In other words, the first configuration portion 43 and the second configuration portion 44 are disposed in the vertical direction by using horizontal 2×vertical 2 (total four) pixels as one unit.

The upper-side first configuration portion 43 is configured to have four photodiodes PD1 to PD4, four transfer gate electrodes 461 to 464 corresponding to the four photodiodes PD1 to PD4, and a first floating diffusion portion FD1. Each of the transfer transistors Tr11 to Tr14 is configured with each of the photodiodes PD1 to PD4, the first floating diffusion portion FD1, and each of the transfer gate electrodes 461 to 464. The floating diffusion portion FD1 is disposed at the central portion surrounded by the four photodiodes PD1 to PD4, and each of the transfer gate electrodes 461 to 464 is disposed at the position corresponding to the corner portion of each of the photodiodes PD1 to PD4.

The lower-side second configuration portion 44 is configured to have four photodiodes PD5 to PD8, four transfer gate electrodes 465 to 468 corresponding to the four photodiodes PD5 to PD8, and a second floating diffusion portion FD2. Each of the transfer transistors Tr15 to Tr18 is configured with each of the photodiodes PD5 to PD8, the second floating diffusion portion PD2, and each of the transfer gate electrodes 465 to 468. The floating diffusion portion FD2 is disposed at the central portion surrounded by the four photodiodes PD5 to PD8, and each of the transfer gate electrodes 465 to 468 is disposed at the position corresponding to the corner portion of each of the photodiodes PD5 to PD8.

A selection transistor Tr4 and an amplification transistor Tr3 are disposed between the first configuration portion 43 and the second configuration portion 44. A reset transistor Tr2 is disposed under the lower-side second configuration portion 44. The selection transistor Tr4 includes a pair of source/drain regions 47 and 48 and a selection gate electrode 51. The amplification transistor Tr3 includes a pair of source/drain regions 48 and 49 and an amplification gate electrode 52. The reset transistor Tr2 includes a pair of source/drain regions 53 and 54 and a reset gate electrode 55. The aforementioned gate electrodes are constructed with, for example, a polysilicon layer. The first floating diffusion portion FD1 and the second floating diffusion portion FD2 are connected to the amplification gate electrode 52 of the amplification transistor Tr3 and the source region of the reset transistor Tr2.

As characteristic configurations of the embodiment, the lower-side second configuration portion 44 surrounded by the dashed line of FIG. 1 and the (horizontal 2×vertical 2) pixels having a reset transistor Tr2, an amplification transistor Tr3, and a selection transistor Tr4 are described. The upper-side first configuration portion 43 also has substantially the same configuration.

As seen from the top plane, the transfer wiring lines 35 to 38, which are electrically connected to the transfer gate electrodes 465 to 468, are disposed to extend in the horizontal direction of the pixel portion and to be in parallel to each other in the vertical direction with a necessary interval. For example, at least one transfer wiring line among the four transfer wiring lines 35 to 38 is disposed to be in parallel so as to traverse the substantially central portions of the photodiodes PD. In this example, the transfer wiring lines 35 and 38 are configured so as to traverse the substantially central portions of the photodiodes PD. In this case, the four transfer wiring lines 35 to 38 preferably have the same line width and the same interval between the wiring lines, but these wiring lines may not necessarily have the same line width and the same interval. As seen from the top plane, the four transfer wiring lines 35 to 38 may have to be disposed to be in parallel by using a metal layer in the later-described same layer or using metal layers of different layers.

At the outer side of the outermost transfer wiring lines 35 and 38, there are later-described parallel wiring lines which are adjacent to the outermost transfer wiring lines 35 and 38 and which are in parallel to the transfer wiring lines 35 and 38 as seen from the top plane, and at least one of the parallel wiring lines is applied with a pulse voltage. In this example, with respect to the outermost transfer wiring lines 35 and 38, the two parallel wiring lines 57 and 59 and the two parallel wiring lines 58 and 60 are disposed respectively. For example, in the case where reading is performed sequentially from the lower-side transfer wiring line 38 toward the upper-side transfer wiring line 35, a pulse voltage is applied to at least the one parallel wiring line, that is, one of the parallel wiring lines 58 and 60 corresponding to the lower-side outermost transfer wiring line 38. On the contrary, in the case where reading is performed sequentially from the upper-side transfer wiring line 35 toward the lower-side transfer wiring line 38, a pulse voltage is applied to at least the one parallel wiring line, that is, one of the parallel wiring lines 57 and 58 corresponding to the upper-side outermost transfer wiring line 35. A sufficient effect may be obtained only by supplying a pulse voltage to one parallel wiring line corresponding to one of the outermost transfer wiring lines. On the contrary, in the configuration where one parallel wiring line corresponding to each of the outermost transfer wiring lines is supplied with a pulse voltage, that is, in the configuration where two parallel wiring lines are simultaneously supplied with pulse voltages, since the change is increased, the configuration is not preferable. For example, since the transfer wiring line 37 is influenced by only the transfer wiring line 38, it is preferable that the transfer wiring line 38 is also influenced to the same extent. The parallel wiring lines may be constructed with a metal layer in the same layer as the transfer wiring lines 35 to 38 or as the metal layers in the upper and lower adjacent layers.

In this example, parallel wiring lines 57 to 60 are aligned at outer sides of the outermost transfer wiring lines 35 and 38 so as to be parallel to the transfer wiring lines 35 and 38 as seen from the top plane. In other words, the parallel wiring lines 57 and 59 are aligned at the outer side of the transfer wiring line 35, and the parallel wiring lines 58 and 60 are aligned at the outer side of the transfer wiring line 38.

The parallel wiring line 57 is aligned along the amplification transistor Tr3 and the selection transistor Tr4. The parallel wiring line 59 is disposed between the parallel wiring line 57 and the transfer wiring line 35. The parallel wiring line 58 is aligned along the reset transistor Tr2. The parallel wiring line 60 is disposed between the parallel wiring line 58 and the transfer wiring line 38.

For example, the transfer wiring lines 35 to 38 and the parallel wiring lines 57 and 58 are constructed with a metal layer in the same layer, and the parallel wiring lines 59 and 60 are constructed with metal layers in a layer upwardly or downwardly adjacent to the metal layers of the transfer wiring lines 35 to 38 and the parallel wiring lines 57 and 58.

In addition, the four transfer wiring lines 35 to 38 may be formed to be divided into two layers, that is, upper and lower adjacent metal layers and to be in parallel to each other. In this case, as seen from the top plane, the four transfer wiring lines are disposed in parallel to each other.

In addition, as another example, the four transfer wiring lines 35 to 38 may be formed to be divided into two layers, that is, the upper and lower adjacent metal layers and to be in parallel to each other so that the upper and lower transfer wiring lines are overlapped with each other. In the recent process, interlayer thickness may be reduced so as to be close to the interval between wiring lines in the same layer, and the intervals between the transfer wiring lines 35 to 38 may be uniformed. Therefore, in this case, it is possible to equalize the coupling capacitances between the four transfer wiring lines 35 to 38.

A constant voltage or a pulse voltage is applied to each of the parallel wiring lines 57, 58, 59, and 60. As the constant voltage, for example, a power source voltage or a ground voltage may be used. As the pulse voltage, a pulse voltage other than the transfer pulse, for example, a reset pulse or a selection pulse may be used.

For example, in the case of the parallel wiring lines 57 and 59, a pulse voltage is applied to the parallel wiring line 57, and a constant voltage is applied to the parallel wiring line 59. On the contrary, a constant voltage is applied to the parallel wiring line 57, and a pulse voltage is applied to the parallel wiring line 59. In the case of the parallel wiring lines 58 and 60, a pulse voltage is applied to the parallel wiring line 58, and a constant voltage is applied to the parallel wiring line 60. On the contrary, a constant voltage is applied to the parallel wiring line 58, and a pulse voltage is applied to the parallel wiring line 60.

As a detailed example, the reset pulse voltage and the selection pulse voltage may be set to pulse voltages, and the power source voltage may be set to a constant voltage. In other words, the upper-side parallel wiring line 59 may be set to the selection wiring line connected to the selection gate electrode 51; the parallel wiring line 57 at the outer side thereof may be set to the power source wiring line, the lower-side parallel wiring line 60 may be set to the reset wiring line connected to the reset gate electrode 55; and the parallel wiring line 58 at the outer side thereof may be set to the power source wiring line. Otherwise, on the contrary, the upper-side parallel wiring line 59 may be set to the power source wiring line; the parallel wiring line 57 at the outer side thereof may be set to the selection wiring line; and the lower-side parallel wiring line 60 may be set to the power source wiring line; and the parallel wiring line 58 at the outer side thereof may be set to the reset wiring line. In the example of FIG. 1, since the two-series power source is used, the constant voltages supplied to the parallel wiring lines 57 and 58 or the parallel wiring lines 59 and 60 at the two outer sides of the transfer wiring lines 35 to 38 become the power source voltages.

In the embodiment, it is preferable that the layout is performed so that the coupling capacitances between the transfer wiring lines 35 to 38 and the wiring lines adjacent thereto are equal to each other and so that the intervals between the transfer wiring lines 35 to 38 and the parallel wiring lines 59 and 60 or 57 and 58 of the outer side thereof, which supply pulse voltages, are substantially equal to each other. For example, in any one of the case where pulse voltages are supplied to the parallel wiring lines 59 and 60 and the case where pulse voltages are supplied to the parallel wiring lines 59 and 58, it is preferable that the intervals between the adjacent wiring lines are configured so as to be substantially equal to each other.

Figure 2:
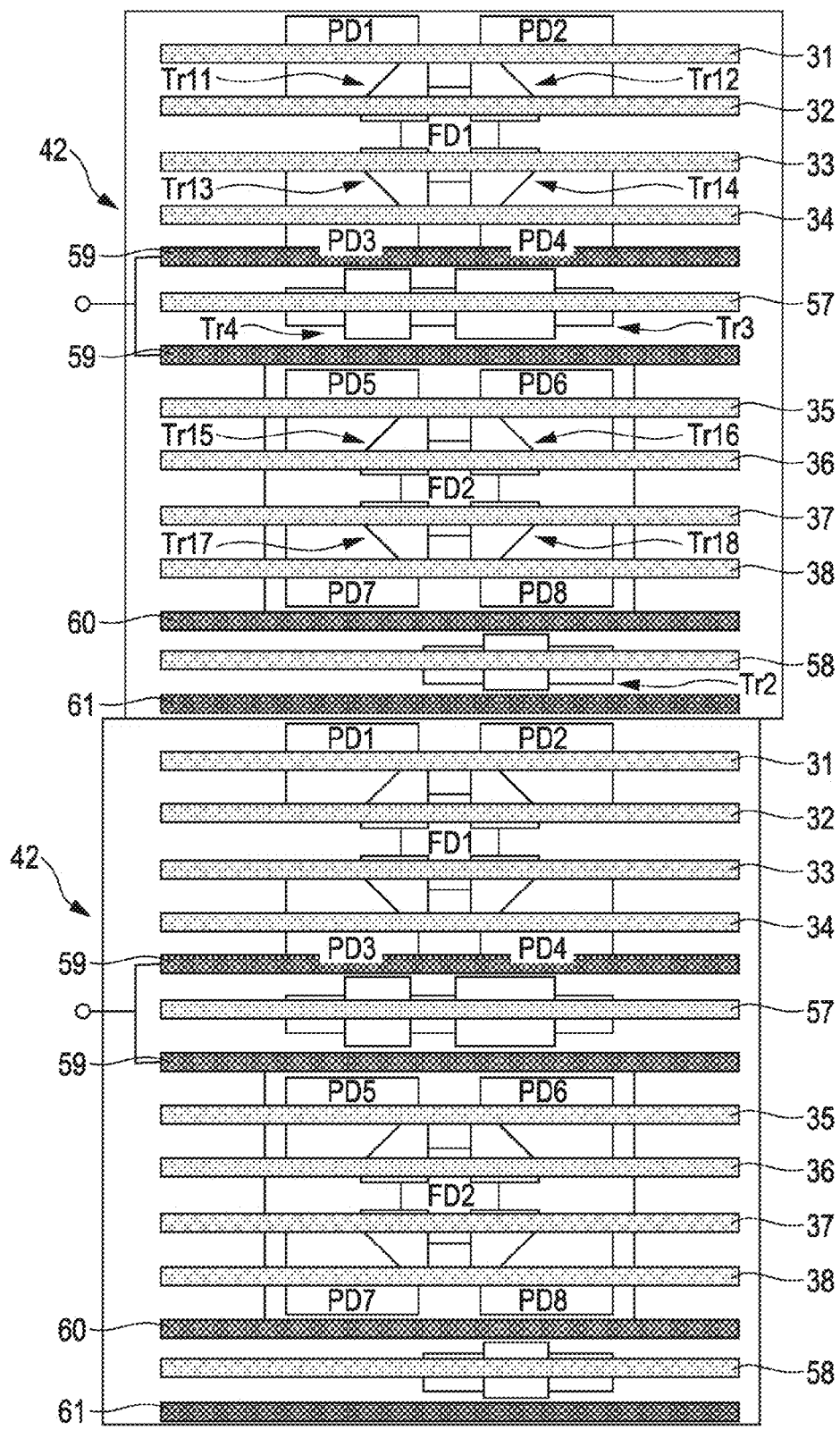
FIG. 2 is a schematic diagram illustrating the more detailed configuration of the main components in the first embodiment of the invention.

The first embodiment is described in detail with reference to FIG. 2. FIG. 2 illustrates a configuration where two sets of 8-pixel sharing units 42 are aligned in the vertical direction. In the illustrated example, the parallel wiring line 59 is set to a selection wiring line for supplying the selection pulse φSEL; the parallel wiring line 60 is set to a reset wiring line for supplying the reset pulse φRST; and the parallel wiring lines 57 and 58 are set to power source wiring lines for supplying the power source voltage. Hereinafter, the parallel wiring lines are referred to as the selection wiring line 59, the reset wiring line 60, the power source wiring lines 59 and 58.

In this example, in the 8-pixel sharing unit 42, the selection wiring lines 59 are disposed to be in parallel to each other in the two sides of the parallel wiring line 57 with the parallel wiring line 57, which is the power source line, interposed therebetween. The two selection wiring lines 59 are electrically connected to each other. In addition, at the outer side of the lower-side power source wiring line 58, a photodiode PD and a ground wiring line 61 for supplying a stabilized well contact voltage, that is, a ground voltage to a semiconductor well area, where the pixel transistor is formed, are disposed. In FIG. 2, the transfer wiring lines 31 to 38 are electrically connected to the transfer gate electrodes 461 to 468 (refer to the reference numerals in FIG. 1) of the corresponding transfer transistors Tr11 to Tr18 (refer to the reference numerals in FIG. 1).

In the aforementioned solid state imaging device according to the first embodiment, the transfer wiring lines 35 to 38 are disposed in parallel, and the parallel wiring lines 57 and 59 and the parallel wiring lines 58 and 60 are disposed to be adjacent to the outermost transfer wiring lines 35 and 38. In addition, in the case where the parallel wiring lines 59 and 60 or the parallel wiring lines 57 and 58 are set to the pulse wiring lines, all the transfer wiring lines 35 to 38 including the outermost transfer wiring lines 35 and 38 exist in an extremely close range from the pulse wiring lines. Therefore, the potential changes of all the transfer wiring lines 35 to 38 in the pixel driving period are equalized by the capacitance coupling, so that it is possible to suppress the variation in the saturation signal amount between the pixels. In other words, although the miniaturization of the pixel size proceeds, it is possible to suppress the potential change of the transfer gate electrode, and it is possible to suppress the potential change in the silicon under the transfer gate, so that it is possible to suppress the variation in the saturation signal amount between the pixels. For this reason, the specification of the saturation signal amount may be set to be high, so that it is possible to improve pixel characteristics (saturation signal amount).

Since the wiring line interval that is arbitrary defined may be changed within design rule, the fine adjustment may be performed by changing the wiring line interval.

Even in the case where any one of parallel wiring lines 57 or 59 or any one of parallel wiring lines 58 or 60 among the parallel wiring lines is set to a pulse voltage supply wiring line, the coupling capacitances between the adjacent wiring lines in the transfer wiring lines 35 to 38 are uniformed, it is possible to suppress the potential change of the transfer gate electrodes. Therefore, although the miniaturization of the pixel size is proceeding, it is possible to suppress the potential change in the silicon under the transfer gate, so that it is possible to suppress the variation in the saturation signal amount between the pixels.

The effect according to the configuration where at least one of the parallel wiring lines is used as a pulse voltage supply line is described. The four parallel-disposed transfer wiring lines 35 to 38 are influenced by one adjacent transfer wiring line except for the outermost transfer wiring line. Therefore, since the outermost transfer wiring line is also influenced by the one adjacent parallel wiring line supplied with a pulse voltage, it is preferable that the outermost transfer wiring line is influenced similarly to the other transfer wiring lines. Since potential change may be controlled by the interval between the wiring lines, even in the case where the two parallel wiring lines adjacent to the two outermost transfer wiring lines are used as the wiring lines which supply pulse voltages, it may equalize the potential change. However, if both wiring lines are in the constant voltages, the potential change does not occur. For example, since the transfer wiring lines 35 to 37 and the transfer wiring line 38 are different from each other in the potential change, a variation in a saturation signal amount occurs.

On the other hand, since there is a parallel wiring line supplying a constant voltage, it is possible to easily equalize the amount of the potential change of the outermost wiring line. If one of the two parallel wiring lines is the pulse wiring line, the outermost transfer wiring line 38 is influenced by one pulse wiring line, and the intermediate transfer wiring lines, for example, transfer wiring lines 35 to 37 can also be easily influenced to the same extent. However, if the two parallel wiring lines are the pulse wiring lines, one parallel wiring line may have to be separated by a considerable interval. If not, the potential change of the outermost transfer wiring line is increased, so that the suppression of the variation of the saturation signal amount may not be easily obtained.

As seen from the top plane, at least one transfer wiring line (in this example, the transfer wiring lines 35 and 38) is disposed in the horizontal direction to pass over the photodiode PD, preferably, to traverse the substantially central portions of the photodiodes PD, so that the interval between the transfer wiring lines 35 and 38 may be increased. The influence of the capacitance coupling between the wiring lines is decreased as much as the interval between the transfer wiring lines is increased, and the potential change at the portion under the gate at the charge accumulating period is suppressed, so that it is possible to suppress the variation of the saturation signal amount. In particular, the embodiment may be very appropriately adapted to a back illumination type CMOS solid state imaging device.

3. Second Embodiment

Example of Configuration of Solid State Imaging Device

Figure 3:
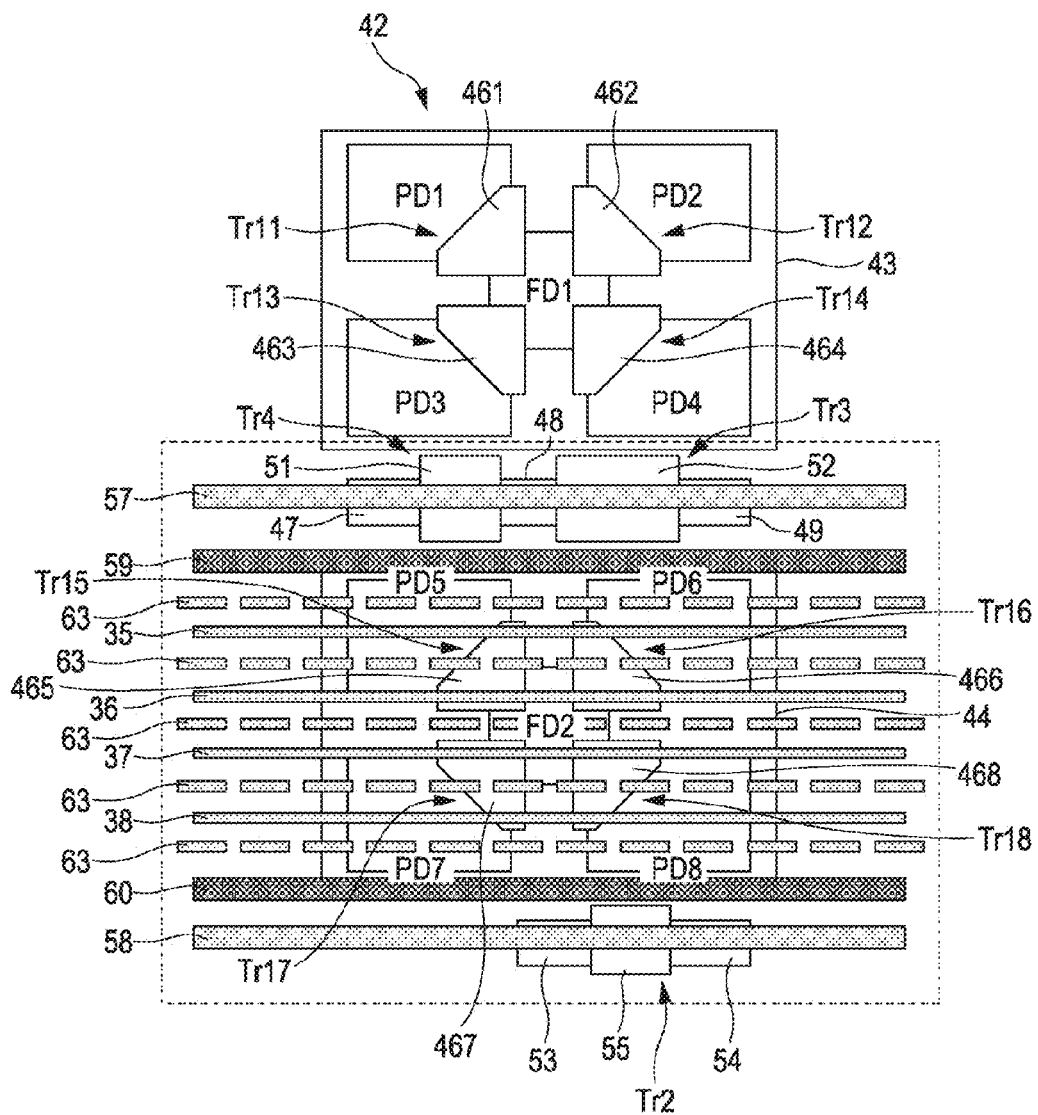
FIG. 3 is a schematic diagram illustrating a configuration of main components of a solid state imaging device according to a second embodiment of the invention.

FIG. 3 illustrates a solid state imaging device according to a second embodiment of the invention. The embodiment may be adapted to a back illumination type CMOS solid state imaging device, where pixel sharing units of 4 pixels, 8 pixels or horizontal 2×vertical 2n (n is a positive integer, that is, n=1, 2, 3, . . . ) pixels are aligned in a two-dimensional array shape. As the pixel sharing unit, horizontal 2×vertical 2 (total four) pixels constitute one unit irrespective of the number of shared pixels. Therefore, similarly to FIG. 1, in FIG. 3, the embodiment is described by using one unit of the horizontal 2×vertical 2 (total four) pixels.

As the solid state imaging device according to the second embodiment, a back illumination type CMOS solid state imaging device where 8-pixel sharing units are disposed in a two-dimensional array shape is adapted. The solid state imaging device 71 according to the second embodiment is configured by further inserting shield wiring lines 63 between the wiring lines of the transfer wiring lines 35 to 38 and between the outermost transfer wiring lines 35 and 38 and the parallel wiring lines 59 and 60 adjacent thereto in the solid state imaging device 41 according to the first embodiment of FIG. 1. The shield wiring line 63 is preferably fixed to a power source voltage or a ground voltage. However, the shield wiring line 63 may be floated in terms of a potential. The shield wiring line 63 is preferably constructed with a metal layer in the same layer as the transfer wiring lines 35 to 38. In addition, the shield wiring line 63 may be constructed with a metal layer upwardly or downwardly adjacent to the metal layer which becomes a transfer wiring line. The shield wiring line 63 is a wiring line for avoiding direct capacitance coupling between the transfer wiring lines 35 to 38 or between the outermost transfer wiring lines 35 and 38 and the parallel wiring lines adjacent thereto, for example, the parallel wiring lines 59 and 60.

The other configurations are the same as those of the first embodiment which is described with reference to FIGS. 1 and 2. Therefore, the same components corresponding to those of FIG. 1 are denoted by the same reference numerals, and the redundant description thereof is omitted.

In the solid state imaging device 71 according to the second embodiment, the shield wiring lines 63 are inserted between the wiring lines of the transfer wiring lines 35 to 38 and between the outermost transfer wiring lines 35 and 38 and the parallel wiring lines 59 and 60 adjacent thereto, so that direct capacitance coupling between the transfer wiring lines is avoided. Accordingly, the potential changes of all the transfer wiring lines 35 to 38 in the pixel driving period is suppressed, so that it is possible to suppress the variation in the saturation signal amount between the pixels. The solid state imaging device 71 is combined with the effect described with reference to FIG. 1, which is obtained by the layout of the pulse wiring lines according to the parallel wiring lines adjacent to the outermost transfer wiring lines 35 and 38, so that a variation in a saturation signal amount is further suppressed. Therefore, although the miniaturization of the pixel size is proceeding, it is possible to suppress the potential change in the silicon under the transfer gate, so that it is possible to suppress the variation in the saturation signal amount between the pixels. For this reason, the specification of the saturation signal amount may be set to be high, so that it is possible to improve pixel characteristics.

However, in the case where the shield wiring line is hard to insert in terms of the design rule or in the case where too excessive insertion of the shield wiring line with a minimum width has no effect in terms of production yields, the shield wiring line is not inserted.

4. Third Embodiment

Example of Configuration of Solid State Imaging Device

Figure 4:
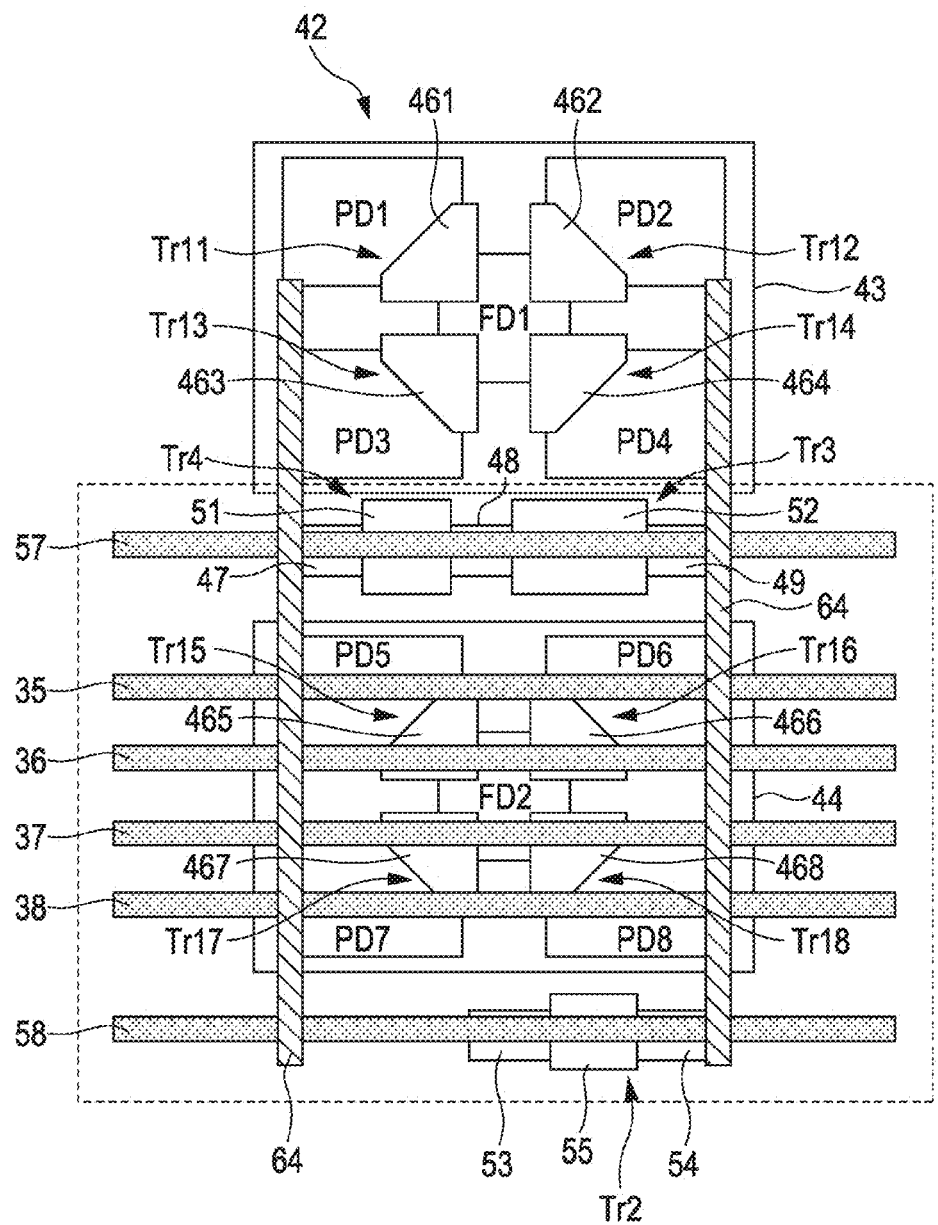
FIG. 4 is a schematic diagram illustrating a configuration of main components of a solid state imaging device according to a third embodiment of the invention.

FIG. 4 illustrates a solid state imaging device according to a third embodiment of the invention. The embodiment may be adapted to a back illumination type CMOS solid state imaging device, where pixel sharing units of 4 pixels, 8 pixels, or horizontal 2×vertical 2n (n is a positive integer, that is, n=1, 2, 3, . . . ) pixels are aligned in a two-dimensional array shape. As the pixel sharing unit, horizontal 2×vertical 2 (total four) pixels constitute one unit irrespective of the number of shared pixels. Therefore, similarly to FIG. 1, in FIG. 4, the embodiment is described by using one unit of the horizontal 2×vertical 2 (total four) pixels.

As the solid state imaging device 73 according to the third embodiment, a back illumination type CMOS solid state imaging device where 8-pixel sharing units are disposed in a two-dimensional array shape is adapted. In the solid state imaging device 73 according to the third embodiment, four transfer wiring lines 35 to 38 and parallel wiring lines 57 and 58, which are adjacent to the outermost transfer wiring lines 35 and 38 and are supplied with pulse voltages, are configured to be constructed with a metal layer in the same layer. In other words, the solid state imaging device 73 according to the embodiment has a configuration where the parallel wiring lines 59 and 60 are omitted in the solid state imaging device 41 according to the first embodiment of FIG. 1.

In addition, for example, the parallel wiring line 57 is connected to the selection gate electrode 51 of the selection transistor Tr4 to be used as a selection wiring line for supplying a selection pulse ϕSEL. The parallel wiring line 58 is connected to the reset gate electrode 55 of the reset transistor Tr2 to be used as a reset wiring line for supplying a reset pulse ϕRST. In addition, as seen from the top plane, wiring lines, for example, vertical signal lines 64 are formed to extend in the vertical direction by different metal layers so as to traverse the transfer wiring lines 35 to 38. In this case, the vertical signal lines 64 are formed so as to intersect all the transfer wiring lines 35 to 38 with the same line width.

The other configurations are the same as those of the first embodiment which is described with reference to FIG. 1. Therefore, the same components corresponding to those of FIG. 1 are denoted by the same reference numerals, and the redundant description thereof is omitted.

In the solid state imaging device 73 according to the third embodiment, since the parallel wiring lines 57 and 58 which supply pulse voltages are disposed to the outer sides of the outermost transfer wiring lines 35 and 38, the potential changes of all the transfer wiring lines 35 to 38 in the pixel driving period are equalized by the same capacitance coupling. Therefore, the potential change of the transfer gate electrode is suppressed, and the potential change in the silicon under the transfer gate is suppressed, so that it is possible to suppress the variation in the saturation signal amount between the pixels. In addition, although, for example, the vertical signal lines 64 are disposed in the vertical direction, the vertical signal lines 64 are configured to intersect all the transfer wiring lines 35 to 38 with the same line width, the influences of the potentials to the vertical signal lines are uniformed over all the transfer wiring lines, so that any problem does not occur.

5. Fourth Embodiment

Example of Configuration of Solid State Imaging Device

Figure 5:
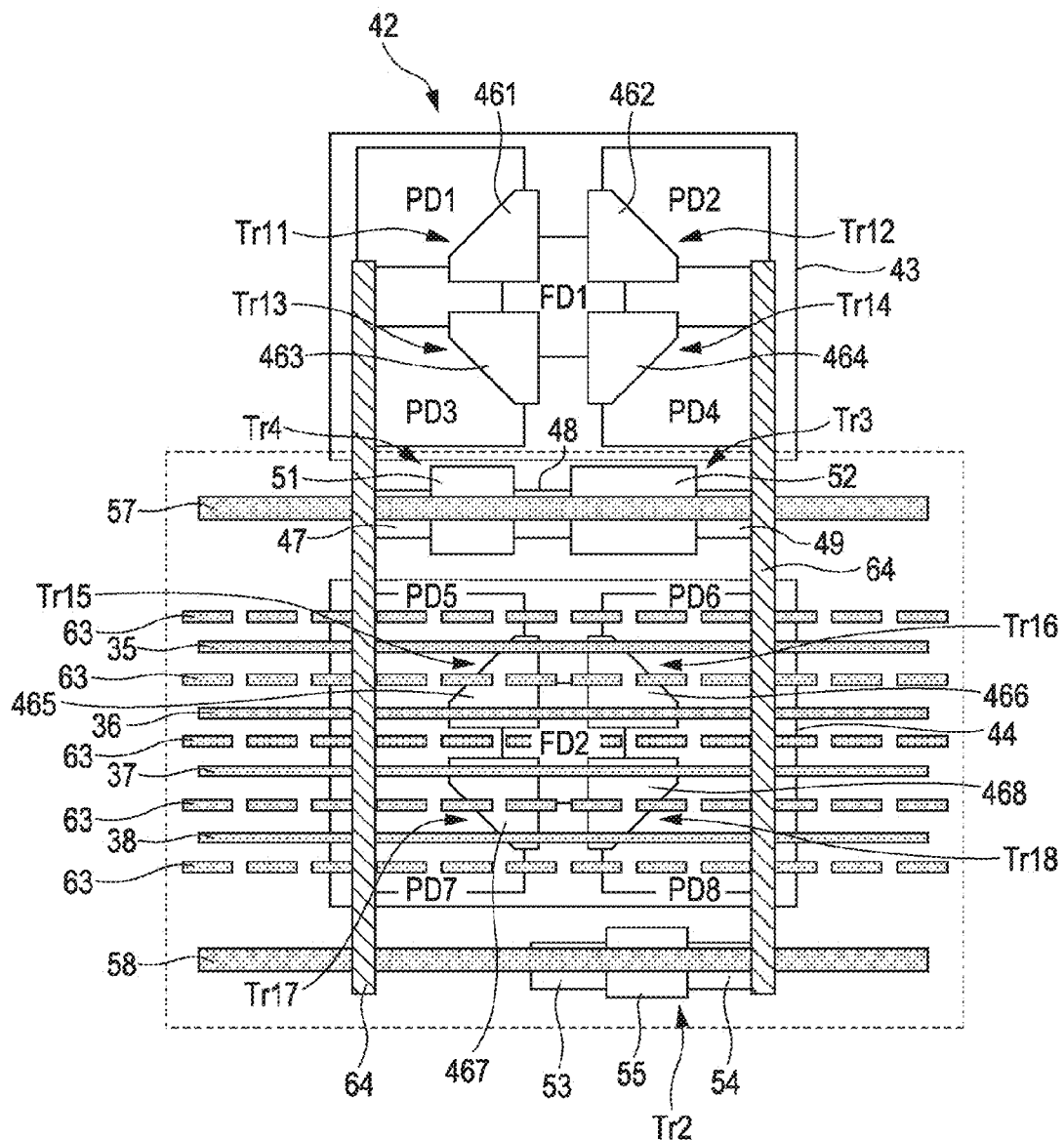
FIG. 5 is a schematic diagram illustrating a configuration of main components of a solid state imaging device according to a fourth embodiment of the invention.

FIG. 5 illustrates a solid state imaging device according to a fourth embodiment of the invention. The embodiment may be adapted to a back illumination type CMOS solid state imaging device, where pixel sharing units of four pixels, eight pixels, or horizontal 2×vertical 2n (n is a positive integer, that is, n=1, 2, 3, . . . ) pixels are aligned in a two-dimensional array shape. As the pixel sharing unit, horizontal 2×vertical 2 (total four) pixels constitute one unit irrespective of the number of shared pixels. Therefore, similarly to FIG. 4, in FIG. 5, the embodiment is described by using one unit of the horizontal 2×vertical 2 (total four) pixels.

As the solid state imaging device 75 according to the fourth embodiment, a back illumination type CMOS solid state imaging device where 8-pixel sharing units 42 are disposed in a two-dimensional array shape is adapted. The solid state imaging device 75 according to the fourth embodiment is configured by further inserting shield wiring lines 63 between the wiring lines of the transfer wiring lines 35 to 38 and between the outermost transfer wiring lines 35 and 38 and the parallel wiring lines 57 and 58 adjacent thereto in the solid state imaging device 73 according to the third embodiment of FIG. 4. The shield wiring line 63 is preferably fixed to a power source voltage or a ground voltage. However, the shield wiring line 63 may be floated in terms of a potential. The shield wiring line 63 is preferably constructed with a metal layer in the same layer as the transfer wiring lines 35 to 38. In addition, the shield wiring line 63 may be constructed with a metal layer upwardly or downwardly adjacent to the metal layer which becomes a transfer wiring line. The shield wiring line 63 is a wiring line for avoiding direct capacitance coupling between the transfer wiring lines 35 to 38 or between the outermost transfer wiring lines 35 and 38 and the parallel wiring lines adjacent thereto, for example, the parallel wiring lines 59 and 60.

The other configurations are the same as those of the third embodiment. Therefore, the same components corresponding to those of FIG. 4 are denoted by the same reference numerals, and the redundant description thereof is omitted.

In the solid state imaging device 75 according to the fourth embodiment, the shield wiring lines 63 are inserted between the wiring lines of the transfer wiring lines 35 to 38 and between the outermost transfer wiring lines 35 and 38 and the parallel wiring lines 57 and 58 adjacent thereto, so that direct capacitance coupling between the transfer wiring lines is avoided. Accordingly, the potential changes of all the transfer wiring lines 35 to 38 in the pixel driving period is suppressed, so that it is possible to suppress the variation in the saturation signal amount between the pixels.

The solid state imaging device 75 is combined with the effect described with reference to FIG. 4, which is obtained by the layout of the pulse wiring lines according to the parallel wiring lines 57 and 58 adjacent to the outermost transfer wiring lines 35 and 38, so that a variation in a saturation signal amount is further suppressed. Therefore, although the miniaturization of the pixel size is proceeding, it is possible to suppress the potential change in the silicon under the transfer gate, so that it is possible to suppress the variation in the saturation signal amount between the pixels. For this reason, the specification of the saturation signal amount may be set to be high, so that it is possible to improve pixel characteristics.

6. Fifth Embodiment

Example of Configuration of Solid State Imaging Device

Figure 6:
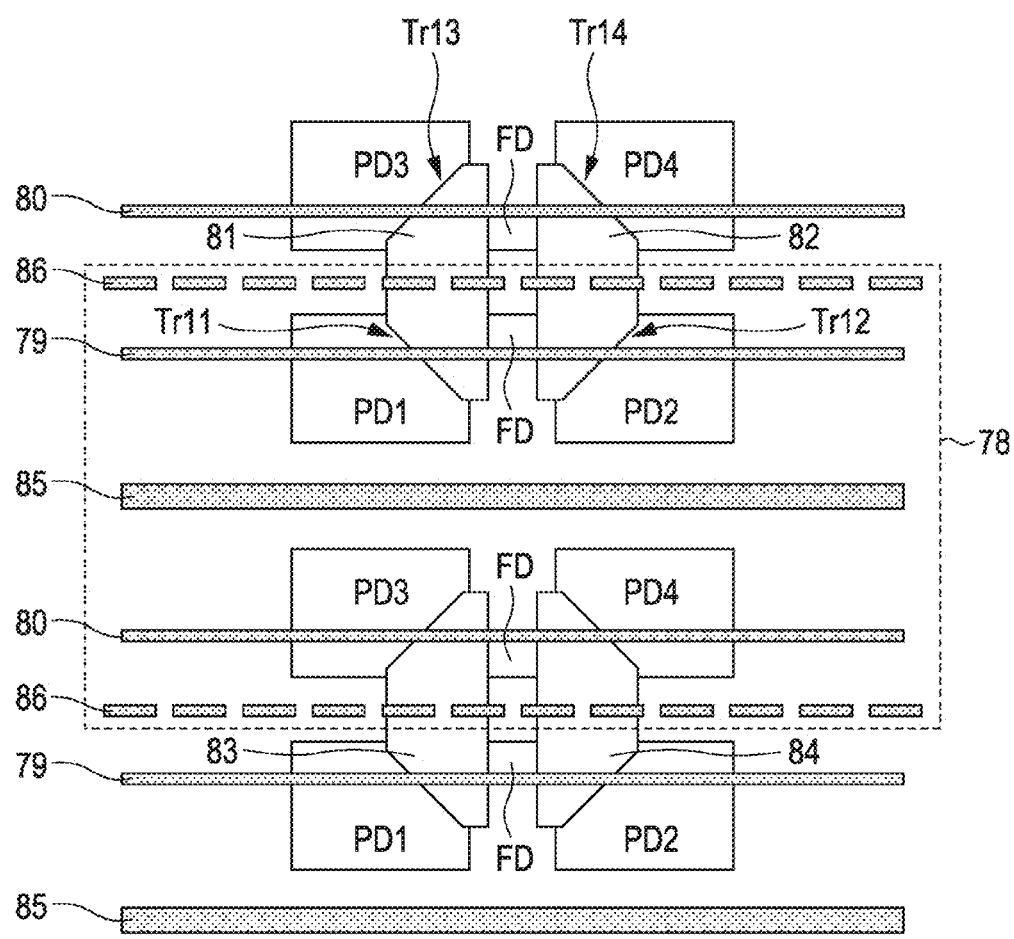
FIG. 6 is a schematic diagram illustrating a configuration of main components of a solid state imaging device according to a fifth embodiment of the invention.

FIG. 6 illustrates a solid state imaging device according to a fifth embodiment of the invention. As the solid state imaging device 77 according to the fifth embodiment, a back illumination type CMOS solid state imaging device where 4-pixel sharing units using horizontal 2×vertical 2 (total four) pixels as one unit are disposed in a two-dimensional array shape is adapted. In the solid state imaging device 77 according to the fifth embodiment, a pixel portion is configured by disposing 4-pixel sharing units 78, where photodiodes PD [PD1 to PD4] of the four pixels are disposed, in a two-dimensional array shape.

In the example, the 4-pixel sharing unit 78 is the area surrounded by a dashed line A. The 4-pixel sharing unit 78 includes horizontal 2×vertical 2 (total four) photodiodes PD. The two photodiodes PD1 and PD2 horizontally disposed are commonly connected to the first floating diffusion portion FDa, and the two photodiodes PD3 and PD4 horizontally disposed are commonly connected to the second floating diffusion portion FDb.

On the other hand, a common transfer gate electrode is formed to straddle the vertically-adjacent two photodiodes between the 4-pixel sharing units 78 which are adjacent to each other in the vertical direction. In other words, a common first transfer gate electrode 81 is formed to straddle two photodiodes, that is, the photodiode PD1 in the 4-pixel sharing unit 78 and the photodiode PD3 in the upper adjacent 4-pixel sharing unit 78. A common second transfer gate electrode 82 is formed to straddle two photodiodes, that is, the photodiode PD2 in the 4-pixel sharing unit 78 and the photodiode PD4 in the upper adjacent 4-pixel sharing unit 78. A common third transfer gate electrode 83 is formed to straddle two photodiodes, that is, the photodiode PD3 in the 4-pixel sharing unit 78 and the photodiode PD1 in the lower adjacent 4-pixel sharing unit 78. A common fourth transfer gate electrode 81 is formed to straddle two photodiodes, that is, the photodiode PD4 in the 4-pixel sharing unit 78 and photodiode PD2 in the lower adjacent 4-pixel sharing unit 78. Accordingly, four transfer transistors Tr11 to Tr14 are configured to be connected to the four photodiodes PD1 to PD4.

In the 4-pixel sharing unit 78 according to this example, although not shown, a reset transistor Tr2, an amplification transistor Tr3, and a selection transistor Tr4 are shared by four photodiodes PD. Various layouts for the reset transistor Tr2, the amplification transistor Tr3, and the selection transistor Tr4 may be considered.

In the embodiment, as seen from the top plane, in the 4-pixel sharing unit 78, two transfer wiring lines 79 and 80 are disposed to extend in the horizontal direction and to be parallel to each other in the vertical direction. One transfer wiring line 79 is connected to, for example, the first transfer gate electrode 81, and the other transfer wiring line 80 is connected to, for example, the fourth transfer gate electrode 82. The transfer wiring line 80 in the upper adjacent 4-pixel sharing unit 78 is connected to the second transfer gate electrode 82. The transfer wiring line 79 in the lower adjacent 4-pixel sharing unit 78 is connected to the third transfer gate electrode 83.

Since the transfer gate electrode is formed over the two pixels, the number of the transfer wiring lines may be decreased. In this case, since two transfer wiring lines 79 and 80 are disposed to be in parallel to each other, at least one of the transfer wiring lines is disposed in the horizontal direction to pass over the photodiodes PD, preferably, to traverse the substantially central portions of the photodiodes PD. In this example, the two transfer wiring lines 79 and 80 are disposed to pass over the photodiodes PD.

The shield wiring lines 86 are disposed in parallel to each other between the two transfer wiring lines 79 and 80 between the 4-pixel sharing units 78 which are adjacent to each other in the vertical direction. In addition, a parallel wiring line 85 is disposed to be in parallel to the transfer wiring lines 79 and 80 between the photodiodes PD which are adjacent to each other in the vertical direction in the 4-pixel sharing unit 78.

The shield wiring line 86 may be used as a wiring line which supplies a constant voltage by using a power source voltage or a ground voltage. In addition, since the two transfer wiring lines 79 and 80 constitutes one set, the shield wiring line 86 may be used as a pulse wiring line which supplies a pulse voltage. In this case, the adjacent parallel wiring line 85 other than the shield wiring line 86 are used between pulse wiring lines or between wiring lines which supply constant voltages.

The parallel wiring line 85 may be used as a wiring line which supplies a fixed voltage or a pulse wiring line which supplies a pulse voltage. The fixed voltage is a power source voltage or a ground voltage. Available combinations of voltages which are supplied to the shield wiring line 86 and the parallel wiring line 85 are as follows. One of the shield wiring line 86 and the parallel wiring line 85 may be used as a pulse wiring line, and the other may be used for a constant voltage. Both of the shield wiring line 86 and the parallel wiring line 85 may be used for pulse voltages. Both of the shield wiring line 86 and the parallel wiring line 85 are used for constant voltages. Herein, similarly to the aforementioned examples, the pulse wiring lines are reset wiring lines and selection wiring lines which supply the necessary pluses to the reset transistors and selection transistors.

The upper and lower parallel wiring lines 85 may have to be wiring lines which supply the same type of voltage (a pulse voltage or a fixed voltage). Referring to the transfer wiring lines 79, the parallel wiring lines 85 have a relatively large influence on the transfer wiring lines 79 in terms of capacitance. The same description may be made with respect to the upper and lower parallel wiring lines 85 and the upper and lower transfer wiring lines 79. If one of the upper and lower parallel wiring lines 85 is in a pulse voltage and the other is in a constant voltage, the parallel wiring line 85 seen from the transfer wiring line 79 becomes a different wiring line as seen periodically. In order to avoid this problem, the upper and lower parallel wiring lines 85 may have to be the wiring lines which supply the same type of voltage (a pulse voltage or a constant voltage).

In the solid state imaging device 77 according to the fifth embodiment, the charges of the pixels are read out in the following manner. The photodiodes PD1 to PD4 are sequentially read, and firstly a pulse voltage is input to the transfer wiring line 79 in the shared unit, so that the charges are transferred from the photodiode PD1 to the floating diffusion portion FD. At this time, the photodiode PD3 in the upper-side shared unit 78 is simultaneously read. The selection transistors of the upper-side and lower-side shared units including the shared unit 78 are turned on at shifted timings, so that the photodiode PD1 and the photodiode PD3 of the upper-side shared unit are sequentially read. Next, in order to read the photodiode PD2, the transfer wiring line 80 in the upper-side shared unit is turned on, so that the charges of the photodiode PD2 are transferred to the floating diffusion portion FD. At this time, the charges of the photodiode PD4 in the upper-side shared unit are also simultaneously transferred, and similarly to the photodiode PD1, the selection transistor is turned on at a shifted timing, so the photodiode PD2 and the photodiode PD4 in the upper-side shared unit are read. With respect to the photodiodes PD3 and PD4 in the shared unit 78, the reading is performed in a similar manner.

In the solid state imaging device 77 according to the fifth embodiment, since the shield wiring line 86 of a constant voltage is inserted between the transfer wiring lines 79 and 80 between the 4-pixel sharing units 78 which are adjacent to each other in the vertical direction, it is possible to reduce the coupling capacitance between the transfer wiring lines. Accordingly, the potential change in all the transfer wiring lines in the pixel driving period is suppressed, and the change of the potential in the silicon is suppressed, so that it is possible to suppress the variation in the saturation signal amount between the pixels.

Even in the case where the shield wiring line 86 is used as a pulse wiring line, it is possible to suppress the change of the capacitance coupling between the adjacent wiring lines of the transfer wiring lines 79 and 80, so that it is possible to suppress the variation in the saturation signal amount between the pixels. In addition, even in the case where the shield wiring line 86 is configured not to be inserted, the interval between the transfer wiring lines 79 and 80 is allowed to be increased, and the transfer wiring lines 79 and 80 are disposed to pass over the photodiodes PD, so that a constant voltage or a pulse voltage may be supplied to the parallel wiring line 85. Accordingly, the influence of the capacitance coupling is reduced, so that it is possible to suppress the variation in the saturation signal amount between the pixels.

7. Sixth Embodiment
Example of Configuration of Solid State Imaging Device

Figure 7:
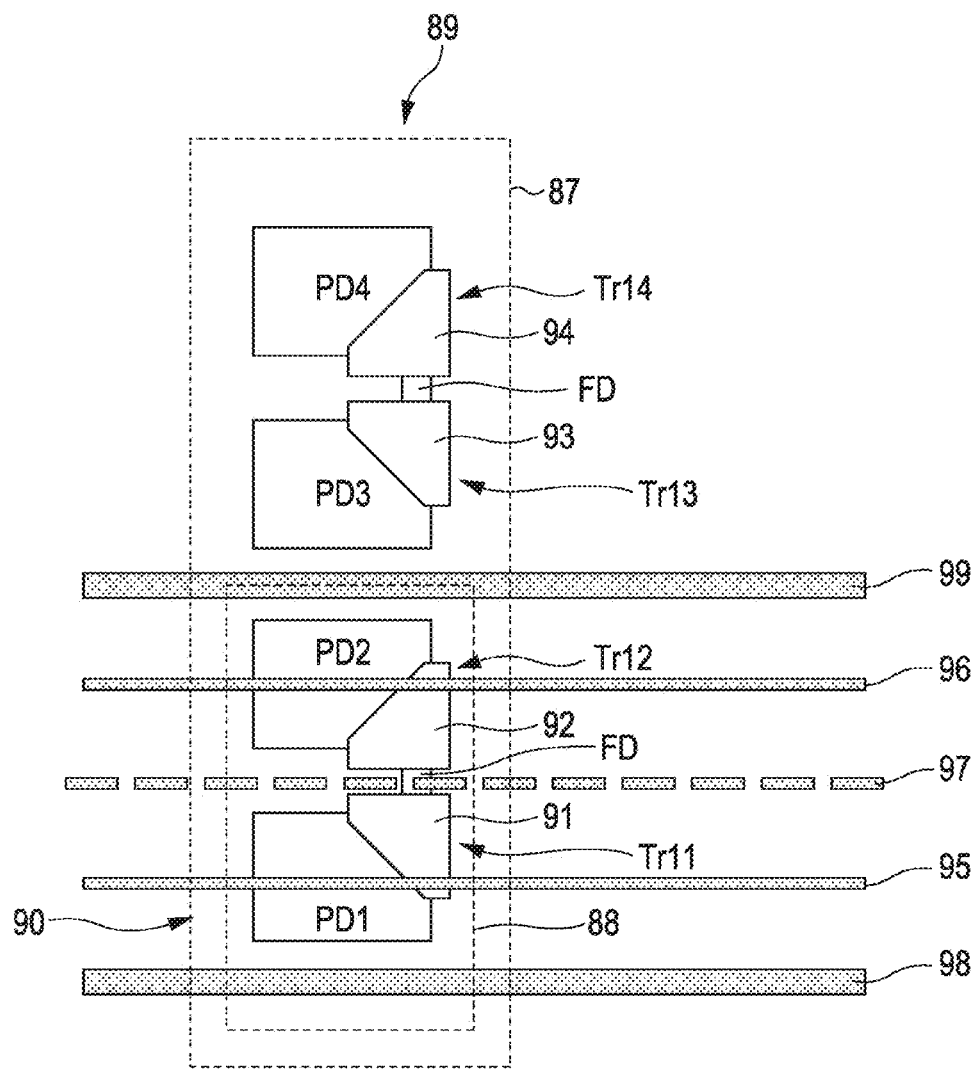
FIG. 7 is a schematic diagram illustrating a configuration of main components of a solid state imaging device according to a sixth embodiment of the invention.

FIG. 7 illustrates a solid state imaging device according to a sixth embodiment of the invention. In the embodiment, a back illumination type CMOS solid state imaging device where 4-pixel sharing units where four pixels are disposed in the vertical direction or 2-pixel sharing units where two pixels are disposed in the vertical direction are disposed in a two-dimensional array shape is adapted. With respect to such a pixel sharing unit, since two-pixel sharing is periodically disposed, the pixel sharing unit is described by using one unit of horizontal 1×vertical 2 (total two) pixels.

In FIG. 7, a dashed line 87 indicates a 4-pixel sharing unit having horizontal 1×vertical 4 (total four) pixels, and a dashed line 88 indicates a 2-pixel sharing unit having horizontal 1×vertical 2 (total two) pixels. In the sixth embodiment, a solid state imaging device 89 is configured by disposing the 4-pixel sharing units 87 in a two-dimensional array shape, and a solid state imaging device 90 is configured by disposing the 2-pixel sharing units 88 in a two-dimensional array shape.

In the 2-pixel sharing solid state imaging device 89 according to the sixth embodiment, the 2-pixel sharing unit 88 includes two photodiodes PD [PD1 and PD2] constituting two pixels in the vertical direction and one shared floating diffusion portion FD. In addition, the solid state imaging device 89 also includes first and second transfer transistors Tr11 and Tr12 having transfer gate electrodes 91 and 92 and, although not shown, a reset transistor Tr2, an amplification transistor Tr3, and a selection transistor Tr4.

In the solid state imaging device 89, the transfer wiring lines 95 and 96 which are connected to the transfer gate electrodes 91 and 92 are disposed to extend in the horizontal direction and to be in parallel to each other in the vertical direction. The transfer wiring lines 95 and 96 are disposed so that at least one of the transfer wiring lines 95 and 96 passes over the photodiodes PD, preferably, traverses the substantially central portions of the photodiodes PD. In this example, two transfer wiring lines 95 and 96 are disposed so as to traverse the substantially central portions of the photodiodes PD1 and PD2.

In the embodiment, particularly, as seen from the top plane, the shield wiring line 97 which extends in the horizontal direction is disposed between the two transfer wiring lines 95 and 96, and the parallel wiring lines 98 and 99 which are in parallel to the transfer wiring lines 95 and 96 are disposed in the outer sides of the two transfer wiring lines 95 and 96. The shield wiring line 97 may be used as a wiring line which supplies a constant voltage by using a power source voltage or a ground voltage. The shield wiring line 97 and the parallel wiring lines 98 and 99 may be constructed with a metal layer in the same layer as the transfer wiring lines 95 and 96. Alternatively, the shield wiring line 97 and the parallel wiring lines 98 and 99 may also be constructed with a metal layer as an upper or lower layer of a metal layer of the transfer wiring lines 95 and 96.

Alternatively, the shield wiring line 97 may be configured as a pulse wiring line which supplies a pulse voltage. In this case, the adjacent wiring lines other than the shield wiring line 97, that is, the parallel wiring lines 98 and 99 are used between pulse wiring lines or between wiring lines which supply constant voltages.

In addition, the shield wiring line 97 may not be inserted, the interval between the transfer wiring lines 95 and 96 may be increased, and the two transfer wiring lines 95 and 96 may pass over the photodiodes PD, so that the parallel wiring lines 98 and 99 may be configured as pulse wiring lines or wiring lines which supply constant voltages.

In the 2-pixel sharing solid state imaging device 90 according to the sixth embodiment, the shield wiring line 97 of a constant voltage is inserted between the two transfer wiring lines 95 and 96, so that it is possible to avoid direct capacitance coupling between the transfer wiring lines 95 and 96. Accordingly, the change in the electrodes of all the transfer wiring lines 93 and 94 in the pixel driving period is suppressed, and the change of the potential in the silicon is suppressed, so that it is possible to suppress the variation in the saturation signal amount between the pixels.

Even in the case where the shield wiring line 97 is used as a pulse wiring line, it is possible to suppress the change of the capacitance coupling between the adjacent wiring lines of the transfer wiring lines 95 and 96, so that it is possible to suppress the variation in the saturation signal amount between the pixels. In addition, even in the case where the shield wiring line 97 is configured not to be inserted, the interval between the transfer wiring lines 95 and 96 is allowed to be increased, and the transfer wiring lines 95 and 96 are disposed to pass over the photodiodes PD, so that a constant voltage or a pulse voltage may be supplied to the parallel wiring lines 98 and 99. Accordingly, the influence of the capacitance coupling is reduced, so that it is possible to suppress the variation in the saturation signal amount between the pixels.

The 4-pixel sharing solid state imaging device 89 according to the sixth embodiment includes four photodiodes PD [PD1 to PD4] constituting four pixels in the vertical direction and two shared floating diffusion portions FD within the 4-pixel sharing unit 87. In addition, the 4-pixel sharing solid state imaging device 89 also include first to fourth transfer transistors Tr11 to Tr14 having transfer gate electrodes 91, 92, 93, and 94, and, although not shown, a reset transistor Tr2, an amplification transistor Tr3, and selection transistor Tr4.

In the embodiment, although not illustrated, similarly, the transfer wiring lines 95 and 96, the shield wiring line 97, and the parallel wiring line 99 are disposed to the upper-side two pixels.

In the 4-pixel sharing solid state imaging device 89 according to the sixth embodiment, by the same effects as the aforementioned solid state imaging device 90, it is possible to suppress a variation in a saturation signal amount between pixels.

In the solid state imaging device according to the above examples, electrons are used as the signal charges. However, a solid state imaging device using holes as the signal charges may be adapted. In this case, the conduction type of each semiconductor area is configured as being an inverted conduction type.

In the aforementioned examples, the invention is adapted to a pixel-shared CMOS solid state imaging device. However, the invention may be adapted to other CMOS solid state imaging devices where unit pixels are disposed in a two-dimensional array shape.

In the aforementioned examples, the invention is adapted to a back illumination type CMOS solid state imaging device. However, the invention may also be adapted to a front illumination type CMOS solid state imaging device.

The invention may be adapted to a CMOS solid state imaging device having color filters in a Bayer array or a CMOS solid state imaging device having color filters in a honeycomb array where pixels are arrayed slantedly. Even in these cases, transfer wiring lines, parallel wiring lines, and shield wiring lines are disposed to extend in the horizontal direction.

8. Seventh Embodiment

Example of Configuration of Electronic Apparatus

The aforementioned solid state imaging device according to the embodiment of the invention may be adapted to an electronic apparatus, for example, a camera system such as a digital camera or a video camera, a mobile phone having a photographing function, other apparatuses having a photographing function, or the like.

Figure 12:
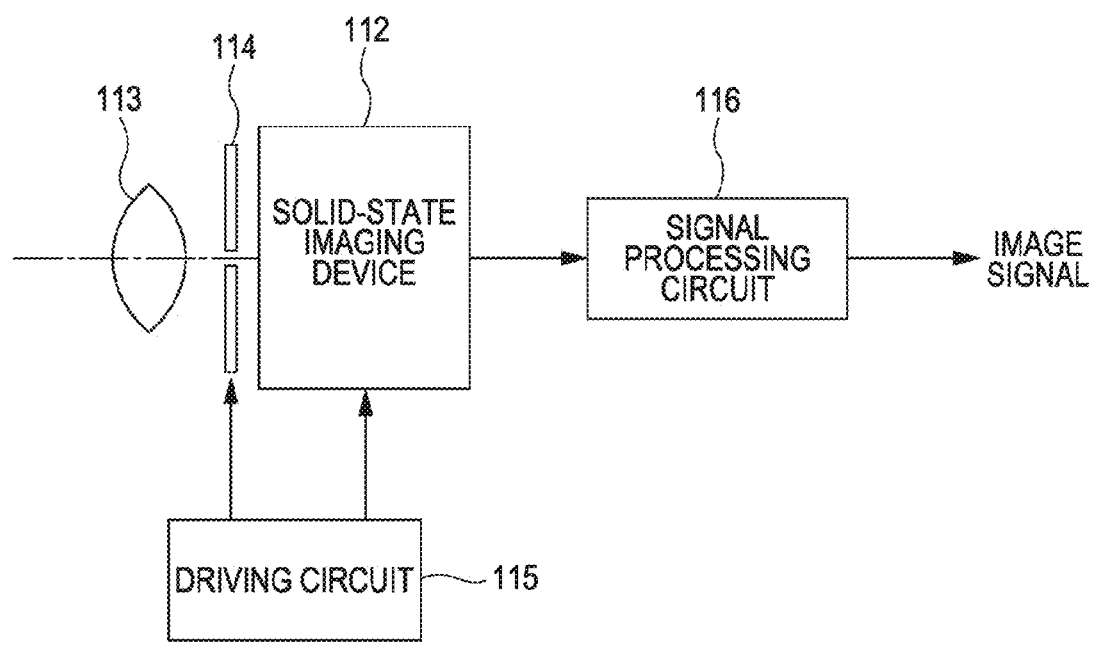
FIG. 12 is a schematic diagram illustrating a configuration of main components of an electronic apparatus according to a seventh embodiment of the invention.

FIG. 12 illustrates a camera as an example of the electronic apparatus according to a seventh embodiment of the embodiment of the invention. In an example of the camera according to the embodiment, a video camera capable of photographing a still picture or a moving picture is used. A camera 111 according to the embodiment includes a solid state imaging device 112, an optical system 113 which guides incident light to a light sensing sensor portion of the solid state imaging device 112, and a shutter unit 114. In addition, the camera 111 also includes a driving circuit 115 which drives the solid state imaging device 112 and a signal processing circuit 116 which processes an output signal of the solid state imaging device 112.

As the solid state imaging device 112, any one of the CMOS solid state imaging device according to the aforementioned embodiments may be used. It is preferable that, as the solid state imaging device 112, particularly, a pixel-sharing back illumination type CMOS solid state imaging device is used. The optical system (optical lens) 113 allows image light (incident light) from a subject to be formed on an imaging plane of the solid state imaging device 112. Accordingly, signal charges are accumulated in the solid state imaging device 112 for a predetermined time interval. The optical system 113 may be configured as an optical lens system including a plurality of optical lenses. The shutter unit 114 controls a light illuminating period and a light shielding period for the solid state imaging device 112. The driving circuit 115 supplies driving signals for controlling a transfer operation of the solid state imaging device 112 and a shutter operation of the shutter unit 114. The signal transferring of the solid state imaging device 112 is performed based on the driving signal (timing signal) supplied from the driving circuit 115. The signal processing circuit 116 processes various types of signals. The processed image signal is stored in a storage medium such as a memory or output to a monitor.

According to an electronic apparatus such as a camera according to the seventh embodiment, in the solid state imaging device 112, it is possible to suppress a variation of a saturation signal amount involved with miniaturization of a pixel size. Therefore, it is possible to provide a high-quality electronic apparatus of which the image quality is improved.

The present application contains subject matter related to that disclosed in Japanese Priority Patent Application JP 2009-272441 filed in the Japan Patent Office on Nov. 30, 2009, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An imaging device, comprising:
   a semiconductor substrate including a plurality of photoelectric conversion portions,
   wherein the plurality of photoelectric conversion portions are arranged to share at least a floating diffusion, a reset transistor electrically connected to the floating diffusion, and an amplification transistor electrically connected to the floating diffusion;
   a first transfer transistor electrically connected to a first photoelectric conversion portion of the plurality of photoelectric conversion portions;
   a plurality of metal layers disposed at a side of the semiconductor substrate opposite a light-incident side of the semiconductor substrate, wherein the plurality of metal layers includes a first metal layer and a second metal layer different than the first metal layer; and
   a well contact wiring line included in the plurality of metal layers, wherein the well contact wiring line is electrically connected to a well contact and is configured to apply a well contact voltage to a semiconductor well area of the imaging device, wherein the well contact wiring line is disposed to extend, at least in part, in a horizontal direction;

wherein the first metal layer includes a first transfer wiring line electrically connected to a gate electrode of the first transfer transistor and disposed to extend in the horizontal direction;

wherein the second metal layer includes a reset wiring line electrically connected to a gate electrode of the reset transistor and disposed to extend in the horizontal direction.

2. The imaging device of claim 1, wherein the plurality of photoelectric conversion portions are further arranged to share a select transistor electrically connected to the amplification transistor.

3. The imaging device of claim 2, wherein the second metal layer includes a row selection wiring line electrically connected to a gate electrode of the select transistor, wherein the row selection wiring line is disposed to extend in the horizontal direction.

4. The imaging device of claim 2, wherein the plurality of metal layers further includes a vertical signal line electrically connected to the select transistor.

5. The imaging device of claim 4, wherein the vertical signal line is disposed to extend in a vertical direction in a different layer of the plurality of metal layers than the first metal layer.

6. The imaging device of claim 2, wherein a gate electrode of the select transistor and a gate electrode of the amplification transistor are disposed along the horizontal direction.

7. The imaging device of claim 1, wherein the first metal layer is disposed adjacent to the second metal layer.

8. The imaging device of claim 1, wherein the gate electrode of the reset transistor is configured to receive a reset pulse via the reset wiring line.

9. The imaging device of claim 1, wherein the first transfer wiring line is arranged to overlap a part of the first photoelectric conversion portion.

10. The imaging device of claim 1, wherein a drain electrode of the reset transistor and a drain electrode of the amplification transistor are configured to receive different voltages.

11. The imaging device of claim 1, wherein a drain electrode of the reset transistor and a drain electrode of the amplification transistor are configured to receive a same voltage.

12. The imaging device of claim 1, further comprising a second transfer transistor electrically connected. to a second photoelectric conversion portion of the plurality of photoelectric conversion portions, wherein the first metal layer further includes a second transfer wiring line disposed to extend in the horizontal direction, wherein the second transfer wiring line is electrically connected to a gate electrode of the second transfer transistor.

13. The imaging device of claim 12, wherein the second transfer wiring line is disposed to overlap a part of the second photoelectric conversion portion.

14. The imaging device of claim 12, further comprising a third transfer transistor electrically connected to a third photoelectric conversion portion, wherein the first metal layer further includes a third transfer wiring line disposed to extend in the horizontal direction, wherein the third transfer wiring line is electrically connected to a gate electrode of the third transfer wiring line, and wherein the second transfer wiring line, the third transfer wiring line, and the reset wiring line are disposed in order in the first metal layer in a vertical direction.

15. The imaging device of claim 14, wherein the second transfer wiring line, the third transfer wiring line, and the reset wiring line are disposed at substantially even intervals in the vertical direction.

16. An electronic apparatus, comprising:

a semiconductor substrate including a plurality of photoelectric conversion portions, wherein the plurality of photoelectric conversion portions are arranged to share at least a floating diffusion, a reset transistor electrically connected to the floating diffusion, and an amplification transistor electrically connected to the floating diffusion;

a first transfer transistor electrically connected to a first photoelectric conversion portion of the plurality of photoelectric conversion portions;

a plurality of metal layers disposed at a side of the semiconductor substrate opposite a light-incident side of the semiconductor substrate, wherein the plurality of metal layers includes a first metal layer and a second metal layer different than the first metal layer; and a well contact wiring line included in the plurality of metal layers, wherein the well contact wiring line is electrically connected to a well contact and is configured to apply a well contact voltage to a semiconductor well area of the imaging device, wherein the well contact wiring line is disposed to extend, at least in part, in a horizontal direction;

wherein the first metal layer includes a first transfer wiring line electrically connected to a gate electrode of the first transfer transistor and disposed to extend in the horizontal direction;

wherein the second metal layer includes a reset wiring line electrically connected to a gate electrode of the reset transistor and to extend in the horizontal direction.

17. The electronic apparatus of claim 16, wherein the plurality of photoelectric conversion portions are further arranged to share a select transistor electrically connected to the amplification transistor.

18. The electronic apparatus of claim 17, wherein the second metal layer includes a row selection wiring line electrically connected to a gate electrode of the select transistor, wherein the row selection wiring line is disposed to extend in the horizontal direction.

19. The electronic apparatus of claim 17, wherein the plurality of metal layers further includes a vertical signal line electrically connected to the select transistor.

20. The electronic apparatus of claim 19, wherein the vertical signal line is disposed to extend in a vertical direction in a different layer of the plurality of metal layers than the first metal layer.

21. The electronic apparatus of claim 17, wherein a gate electrode of the select transistor and a gate electrode of the amplification transistor are disposed along the horizontal direction.

22. The electronic apparatus of claim 16, wherein the first metal layer is disposed adjacent to the second metal layer.

23. The electronic apparatus of claim 16, wherein the gate electrode of the reset transistor is configured to receive a reset pulse via the reset wiring line.

24. The electronic apparatus of claim 16, wherein the first transfer wiring line is arranged to overlap a part of the first photoelectric conversion portion.

25. The electronic apparatus of claim 16, wherein a drain electrode of the reset transistor and a drain electrode of the amplification transistor are configured to receive different voltages.

26. The electronic apparatus of claim 16, wherein a drain electrode of the reset transistor and a drain electrode of the amplification transistor are configured to receive a same voltage.

27. The electronic apparatus of claim 16, further comprising a second transfer transistor electrically connected to a second photoelectric conversion portion of the plurality of photoelectric conversion portions,
   wherein the first metal layer further includes a second transfer wiring line disposed to extend in the horizontal direction, wherein the second transfer wiring line is electrically connected to a gate electrode of the second transfer transistor.

28. The electronic apparatus of claim 27, wherein the second transfer wiring line is disposed to overlap a part of the second photoelectric conversion portion.

29. The electronic apparatus of claim 27, further comprising a third transfer transistor electrically connected to a third photoelectric conversion portion,
   wherein the first metal layer further includes a third transfer wiring line disposed to extend in the horizontal direction,
   wherein the third transfer wiring line is electrically connected to a gate electrode of the third transfer transistor, and wherein the second transfer wiring line, the third transfer wiring line, and the reset wiring line are disposed in order in the first metal layer in a vertical direction.

30. The electronic apparatus of claim 29, wherein the second transfer wiring line, the third transfer wiring line, and the reset wiring line are disposed at substantially even intervals in the vertical direction.

\* \* \* \* \*